US008364045B2

(12) United States Patent
Ishikawa et al.

(10) Patent No.: US 8,364,045 B2
(45) Date of Patent: Jan. 29, 2013

(54) WAVELENGTH CONTROL METHOD AND OPTICAL TRANSMISSION DEVICE

(75) Inventors: Tomohisa Ishikawa, Kawasaki (JP); Hiroshi Kuzukami, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 280 days.

(21) Appl. No.: 12/805,690

(22) Filed: Aug. 13, 2010

(65) Prior Publication Data
US 2011/0052207 A1 Mar. 3, 2011

(30) Foreign Application Priority Data
Sep. 1, 2009 (JP) ................................. 2009-201535

(51) Int. Cl.
*H04B 10/00* (2006.01)
*H04B 10/12* (2006.01)
(52) U.S. Cl. ............................ 398/196; 398/95; 398/182
(58) Field of Classification Search ............... 372/29.02, 372/32; 398/25, 34, 95, 137, 139, 182, 195, 398/196
See application file for complete search history.

(56) References Cited

U.S. PATENT DOCUMENTS

| 6,782,017 B1 * | 8/2004 | Kai et al. ................... 372/29.02 |
| 2001/0019562 A1 | 9/2001 | Kai et al. |
| 2003/0035617 A1 * | 2/2003 | Plourde et al. .................. 385/24 |
| 2004/0013352 A1 * | 1/2004 | Khayim et al. ................. 385/24 |

FOREIGN PATENT DOCUMENTS

| JP | 2001-251013 | 9/2001 |
| WO | 03/079504 | 9/2003 |
| WO | 2004/068660 | 8/2004 |

OTHER PUBLICATIONS

European Search Report dated Oct. 27, 2011 in Appln. No. 10174479.5.
Japanese Patent Office Action issued in Japanese Patent Application No. 2009-201535 dated Nov. 20, 2012.

* cited by examiner

*Primary Examiner* — Kenneth N Vanderpuye
*Assistant Examiner* — Daniel Dobson
(74) *Attorney, Agent, or Firm* — Staas & Halsey LLP

(57) ABSTRACT

An optical transmission device in which: a first cyclic filter with a fixed transmission wavelength characteristic and a second cyclic filter with a variable transmission wavelength characteristic are combined, and the transmission wavelength characteristic of the second cyclic filter is changed according to a target wavelength, to thereby control the relative phase relationship of the transmission wavelength characteristics of the first and second cyclic filters. Moreover a light source is controlled according to a monitored value of the transmittance of the second cyclic filter with respect to the control target light, to thereby match the wavelength of the control target light with the target wavelength. Consequently, it is possible, with a simple configuration using a combination of two cyclic filters, to variably control wavelength at arbitrary wavelength intervals at a high level of precision.

12 Claims, 19 Drawing Sheets

WAVELENGTH CONTROL METHOD AND OPTICAL TRANSMISSION DEVICE

CROSS-REFERENCE TO RELATED APPLICATION

This application is based upon and claims the benefit of priority of the prior Japanese Patent Application No. 2009-201535, filed on Sep. 1, 2009, the entire contents of which are incorporated herein by reference.

FIELD

The embodiment discussed herein is related to a wavelength control method and an optical transmission device for variably controlling the wavelength of light output from a light source in optical communication.

BACKGROUND

The wavelength (frequency) of light output from a light source such as a semiconductor laser changes, depending on the temperature, driving electric current, and so forth of the light source. As a wavelength control method for stabilizing (locking) the output light of a light source at a predetermined wavelength, there is known for example a method where a cyclic filter (for example, an etalon filter or the like) having a characteristic in which transmittance with respect to wavelength changes at a constant cycle, is utilized as a control reference. In this wavelength control method, there is defined a point that serves as a wavelength control target that conforms to the transmission wavelength characteristic of the cyclic filter (hereunder, referred to as "a wavelength locking point"). Then the light output from a light source is given to the cyclic filter, a transmittance of the cyclic filter is found based on the result of monitoring the power of the transmitted light, and a feedback control of the temperature of the light source is performed, so that the transmittance becomes a value that corresponds to the above wavelength locking point. As for the cyclic filter that serves as the above control reference, in order to suppress variation in the transmission wavelength characteristic caused by temperature changes, there may be used materials having a low level of temperature dependency, or there may be performed a control that maintains the filter temperature at a constant temperature, using a temperature monitor.

In such a wavelength control method as above, in those cases where the wavelength locking point is set on a peak portion in the transmission wavelength characteristic of the cyclic filter (in the vicinity of the maximal peak of transmittance) or on a valley portion (in the vicinity of the minimal peak of transmittance), variation in the transmitted light power with respect to variation in wavelength becomes smaller. Therefore it becomes difficult to ensure a sufficient level of transmittance monitoring sensitivity. Consequently, the wavelength locking point is normally set on a slope portion positioned intermediately between the peak portion and the valley portion. Specifically, for example as illustrated in FIG. 1, wavelength locking points A, B, C, and so on are defined in the approximate center of the right-up slope portions which rise from the valley to the peak in the transmission wavelength characteristic of the cyclic filter. Moreover, although here omitted in the diagram, wavelength locking points may also be defined on the right-down slope portions which fall from the peak to the valley, or on both of the slope portions which rise from the valley to the peak and fall from the peak to the valley.

In the setting of such wavelength locking points, intervals of the output wavelength of the light source that can be controlled by the above wavelength control method, are dependent on the cycle of the cyclic filter. In the example of FIG. 1, the free spectrum range (FSR) of the cyclic filter is 50 GHz. Therefore intervals of the output wavelength of the light source that can be controlled become 50 GHz in a case where one of the right-up slope portion and the right-down slope portion is used, and they become 25 GHz in a case where both of the slope portions are used. Here FSR represents frequency intervals between adjacent transmission peaks.

Incidentally, in a wavelength division multiplexing (WDM) type optical communication system, it is required in recent years that intervals of the wavelength (frequency) of a plurality of optical signals constituting a WDM light can be variably set on the user side (this may also be called multigrid). In a case where, in response to this requirement, a wavelength control of each optical signal is performed with an application of the above wavelength control method, there is a problem in that the level of control precision may possibly be reduced for the wavelength intervals that do not correspond to the cycle of the cyclic filter used as a control reference. For example, assuming a case where the aforementioned cyclic filter of 50 GHz FSR is used, and wavelength control that corresponds to a grid of 37.5 GHz intervals is to be performed, then as illustrated in FIG. 2, a high level of control precision is realized at wavelength locking points A and C set on the slope portions of the transmission wavelength characteristic of the cyclic filter, while a drop in the level of control precision at wavelength locking points B and D set on the peak portions and the valley portions cannot be avoided.

In relation to the above problem, as for the wavelength control method that uses a cyclic filter, there has been proposed a method in which a plurality of cyclic filters having different cyclic characteristics are combined to thereby perform wavelength control. For example, International Publication Pamphlet No. WO 2004/068660 discloses a technique in which a first etalon having a relatively long cycle and a second etalon having a relatively short cycle are combined. Then after having locked the output wavelength of a laser diode (LD) with the first etalon, the temperature of the LD chip at this time is changed by a predetermined amount to shift the wavelength into a target wavelength pull-in range of the second etalon. Furthermore the output wavelength of the LD is locked with the second etalon, and thereby the wavelength of the LD can be locked to the target wavelength even for narrow wavelength intervals. Such a technique for controlling wavelength, in which cyclic filters of different transmission wavelength characteristics are combined, may become one of the effective methods that enable multigrid capability.

However, in order to realize wavelength control that is capable of handling multigrid with a combination of cyclic filters of different transmission wavelength characteristics, it is necessary to prepare a number of cyclic filters capable of handling all assumed wavelength intervals, and there is a problem in that the configuration becomes complex.

Specifically, there is described a configuration in a case where wavelength intervals as multigrid, namely 50 GHz, 37.5 GHz, 33.3 GHz, and 25 GHz are assumed, and wavelength control capable of handling all of the wavelengths is realized. In this case, assuming a cyclic filter having a 50 GHz FSR serving as a reference, then for wavelength intervals of 50 GHz, as illustrated in the first row of FIG. 3, wavelength locking points A, B, and C may be set on the slope portions which rise from the valley to the peak in the transmission wavelength characteristic of the cyclic filter (or on the slope portions which fall from the peak to the valley), to thereby perform wavelength control. Moreover, for wavelength intervals of 25 GHz, the wavelength intervals become ½ of 50 GHz. Therefore as illustrated in the second row of FIG. 3, it is possible to perform wavelength control by setting wavelength locking points A, A', B, B', C, and C' on both of the slope portions which rise from the valley to the peak and fall from the peak to the valley in the transmission wavelength characteristic of the cyclic filter.

On the other hand, for wavelength intervals of 37.5 GHz, the wavelength intervals become ¾ of 50 GHz. Therefore if the above reference cyclic filter (FSR=50 GHz) is used, wavelength locking points are to be set on the peak portions and valley portions in the transmission wavelength characteristic (refer to FIG. 2). If the wavelength locking points are set on the peak portions and valley portions as described above, the level of wavelength control precision is reduced. Therefore as illustrated in the third row of FIG. 3, it is consequently necessary to prepare a cyclic filter having a 37.5 GHz FSR, with a cycle that differs from that of the reference cyclic filter, and set wavelength locking points D, E, and F on the slope portions which rise from the valley to the peak (or on the slope portions which fall from the peak to the valley) in the transmission wavelength characteristic, to thereby perform wavelength control.

Moreover, for wavelength intervals of 33.3 GHz, the wavelength intervals become approximately ⅔ of 50 GHz, and consequently, wavelength locking points are set in the vicinity of the peak portions and valley portions in the transmission wavelength characteristic of the reference cyclic filter. Therefore, as illustrated in the fourth row of FIG. 3, it is necessary to prepare a cyclic filter having a 33.3 GHz FSR, which further differs from those of the respective cyclic filters of 50 GHz FSR and 37.5 GHz FSR, and set wavelength locking points G, H, and I on the slope portions which rise from the valley to the peak (or on the slope portions which fall from the peak to the valley) in the transmission wavelength characteristic, to thereby perform wavelength control.

Consequently, in order to realize wavelength control capable of handling multigrid of wavelength intervals of 50 GHz, 37.5 GHz, 33.3 GHz, and 25 GHz, it is necessary to prepare three types of cyclic filters having different cycles, provide a monitoring system for each of the cyclic filters, and perform control of the output wavelength of the light source while switching the monitoring systems according to wavelength interval settings, and this will cause the configuration to become more complex. If the conditions of the wavelength intervals increase, the number of required cyclic filters may also increase, and consequently an even more complex configuration will be necessary.

SUMMARY

Accordingly, the invention provides a wavelength control method that controls the wavelength of light using a cyclic filter, the transmittance of which cyclically changes with respect to wavelength. An aspect of this wavelength control method includes: giving a control target light respectively to a first cyclic filter with a fixed transmission wavelength characteristic, and to a second cyclic filter with a variable transmission wavelength characteristic, and monitoring each transmittance of the first and second cyclic filters with respect to the control target light; changing the transmission wavelength characteristic of the second cyclic filter according to the monitored value of the respective transmittances, to thereby control the relative phase relationship of the transmission wavelength characteristics of the first and second cyclic filters, and controlling the wavelength of the control target light according to the monitored value of the transmittance of the second cyclic filter with respect to the control target light.

Moreover, in an aspect of the optical transmission device according to the invention there is provided: a light source configured to output an optical signal of variable wavelength; an optical splitter configured to branch part of the optical signal output from the light source as a monitoring light; and a wavelength controller having a first cyclic filter section and a second cyclic filter section to which the monitoring light branched by the splitter is respectively given, and a wavelength control circuit configured to control the output wavelength of the light source based on output information of the first and second cyclic filter sections. The first cyclic filter section has: a first cyclic filter that has a transmission wavelength characteristic in which the transmittance changes cyclically, and to which the monitoring light branched in the splitter is given; a first transmitted light power detector configured to detect the transmitted light power of the first cyclic filter; and a transmission wavelength characteristic fixing section configured to fix the transmission wavelength characteristic of the first cyclic filter. The second cyclic filter section has: a second cyclic filter that has a transmission wavelength characteristic in which the transmittance changes cyclically, and to which the monitoring light branched in the splitter is given; a second transmitted light power detector configured to detect the transmitted light power of the second cyclic filter; and a transmission wavelength characteristic variable section configured to variably control the transmission wavelength characteristic of the second cyclic filter. The wavelength control circuit is configured to monitor the respective transmittances of the first and second cyclic filters with respect to the monitoring light based on the detection results of the first and second transmitted light power detectors, and to use the transmission wavelength characteristic variable section in order to change the transmission wavelength characteristic of the second cyclic filter, according to the monitored value of the respective transmittances, to thereby control the relative phase relationship of the transmission wavelength characteristics of the first and second cyclic filters, and then to control the output wavelength of the light source according to the monitored value of the transmittance based on the detection results of the second transmitted light power detector.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereunder, an embodiment of the invention is described in detail, with reference to the accompanying drawings.

Figure 1:
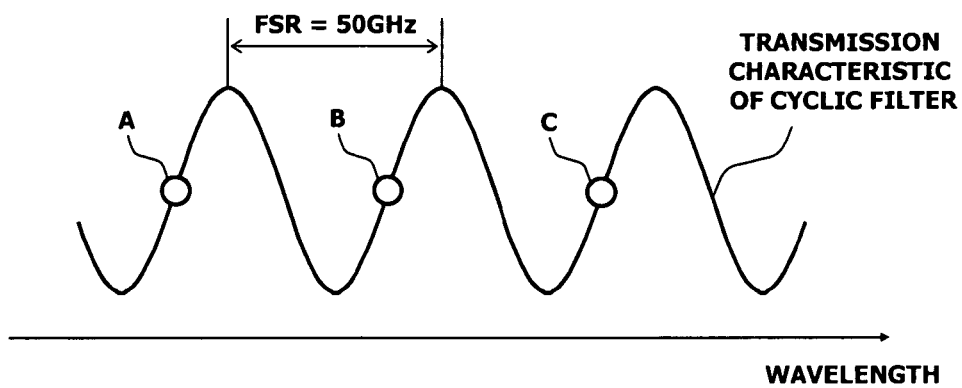
FIG. 1 is a diagram illustrating wavelength locking points in a conventional wavelength control method that uses a cyclic filter.
Figure 2:
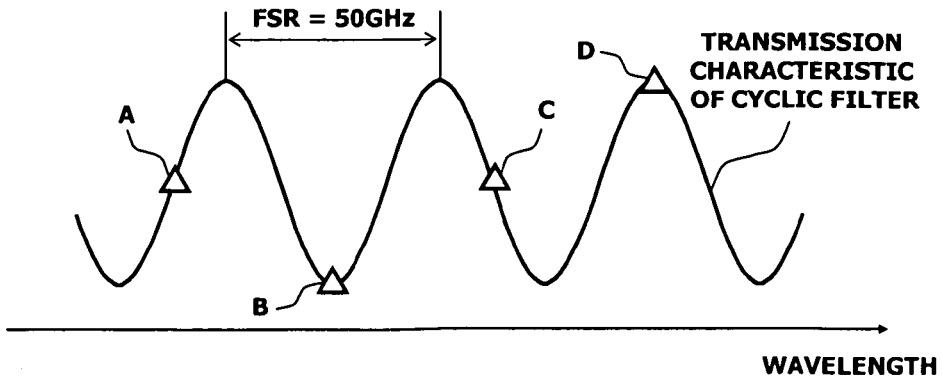
FIG. 2 is a diagram for describing a reduction in control precision in a case where multigrid handling is enabled by the conventional wavelength control method with use of a cyclic filter.
Figure 3:
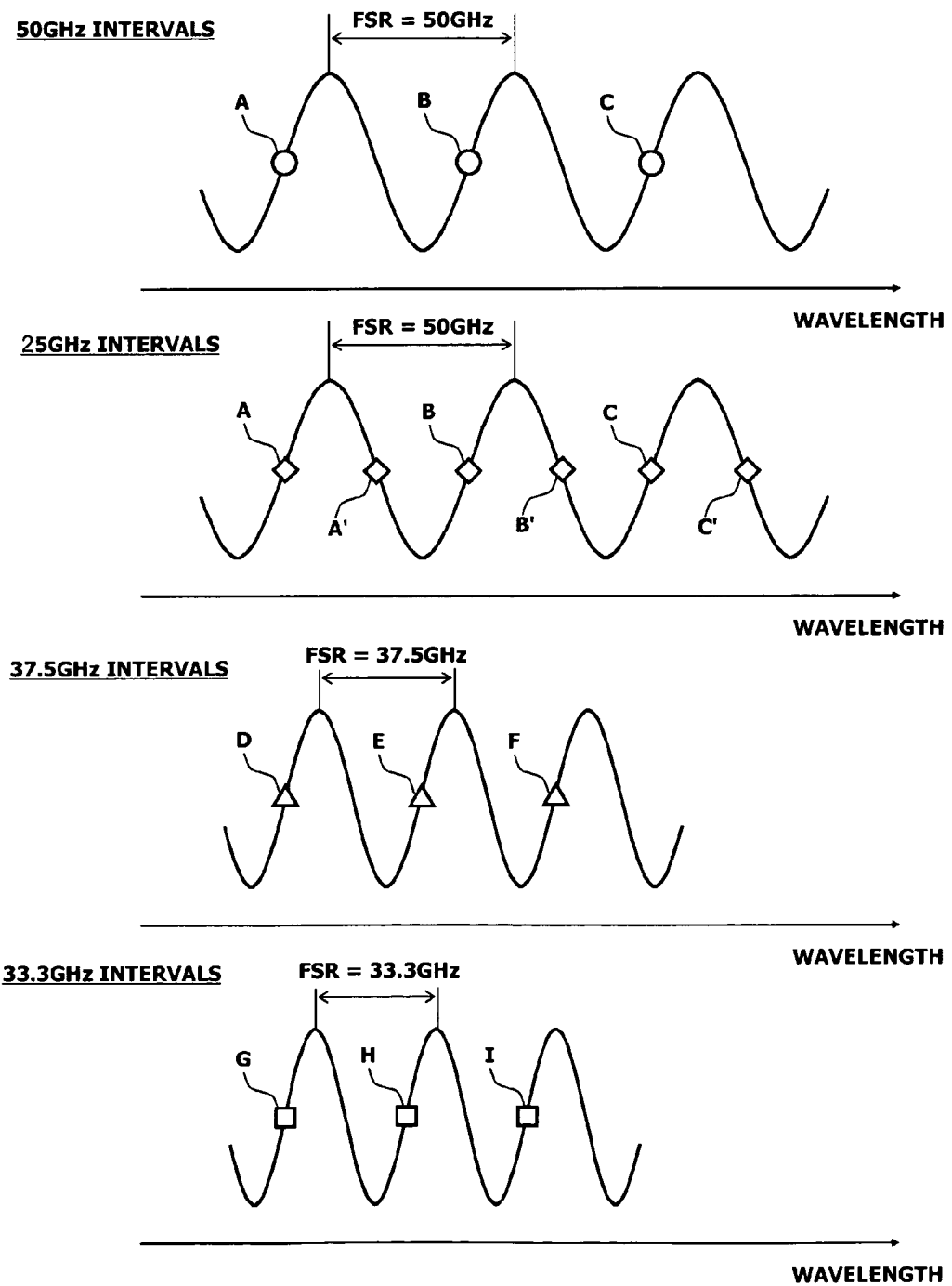
FIG. 3 is a diagram for describing problems in a case where multigrid handling is enabled by the conventional wavelength control method in which a plurality of cyclic filters that have different cyclic characteristics are combined.
Figure 4:
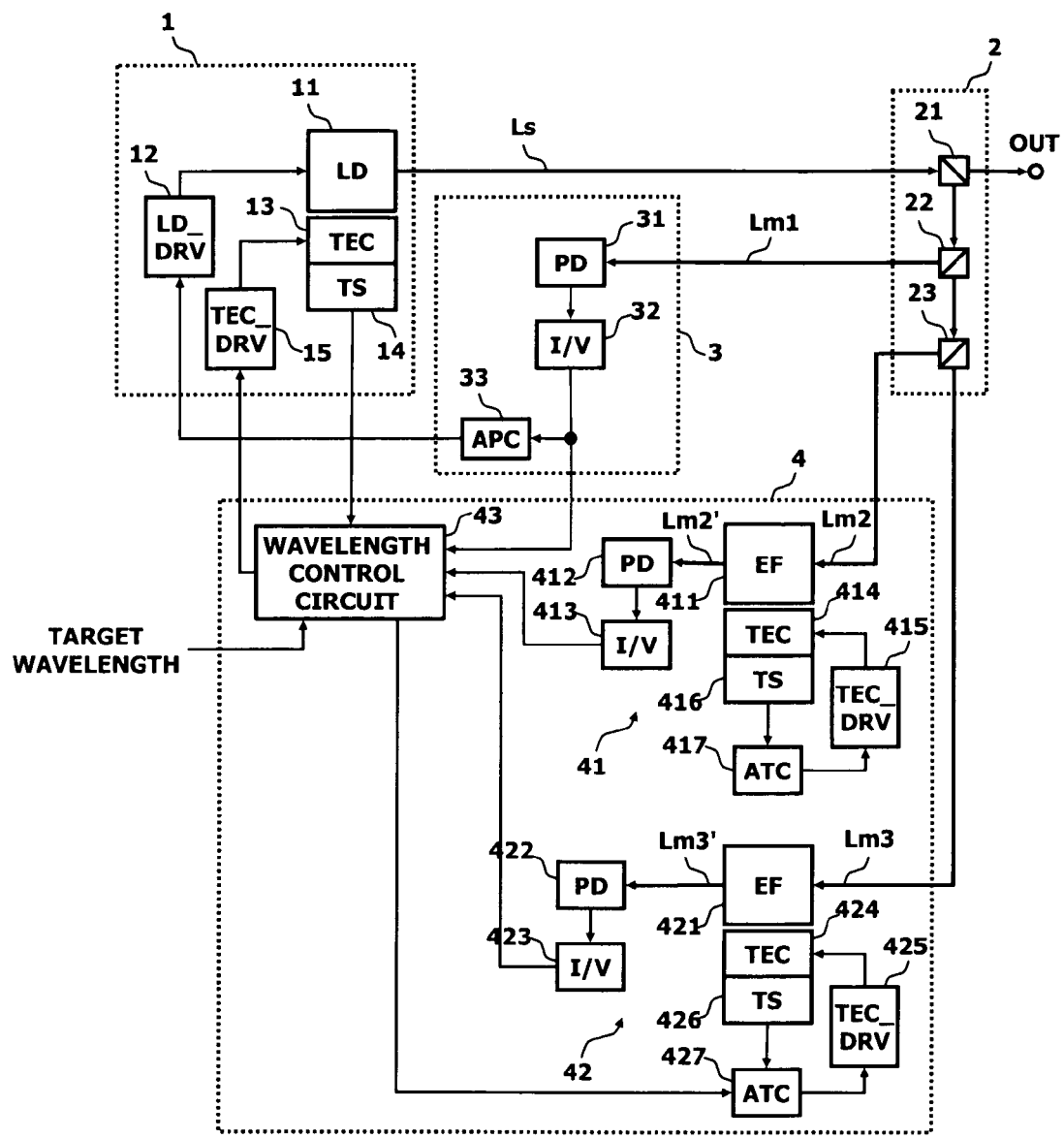
FIG. 4 is a block diagram illustrating a configuration of an embodiment of an optical transmission device.

FIG. 4 is a block diagram illustrating a configuration of an embodiment of an optical transmission device.

In FIG. 4, an optical transmission device of the present embodiment is provided with; a light source 1, an optical splitter 2, an optical power controller 3, and a wavelength controller 4.

The light source 1, for example, has a light source (LD) 11 that generates an optical signal, a driving circuit (LD_DRV) 12 that drives the light source 11, a temperature control element (TEC) 13 that controls the temperature of the light source 11, a temperature monitoring element (TS) 14 that detects the surrounding temperature of the light source 11, and a driving circuit (TEC_DRV) 15 that drives the temperature control element 13. The optical signal may include a continuous wave light.

The light source 11 is a common signal light source such as semiconductor laser, and it generates an optical signal Ls upon receipt of supply of driving electric current from the driving circuit 12, and outputs the optical signal Ls through the optical splitter 2 to an output port OUT. The driving circuit 12 generates a driving electric current, the level of which changes according to a required modulation signal, and directly modulation-drives the light source 11 with the driving electric current. The amplitude level of this driving electric current is controlled according to a control signal output from the optical power controller 3.

Here is illustrated an example in which the driving method of the light source 11 is direct modulation. However an external modulation method may also be applied. In the case of the external modulation method, a driving electric current at a constant level controlled by the optical power controller 3 is supplied to the light source 11, and an output of continuous light from the light source 11 is given to an external modulator, to thereby perform optical modulation. The external modulator may be disposed on an optical path between the light source 11 and the optical splitter 2, or on an optical path between the optical splitter 2 and the output port OUT.

As for the temperature control element 13, the temperature of the light source 11 can be adjusted by attaching a Peltier element or the like to the light source 11. The temperature monitoring element 14, with a thermistor or the like having been disposed in the vicinity of the light source 11, detects the surrounding temperature of the light source 11 and transmits the detection results to the wavelength controller 4. The driving circuit 15 of the temperature control element 13, according to control signals output from the wavelength controller 4, drives the temperature control element 13 to thereby control the temperature of the light source 11.

The optical splitter 2 has, for example, three optical couplers 21, 22, and 23. The first optical coupler 21 branches the optical signal Ls output from the light source 11 into two lights, outputs one of them as transmitted light to the output port OUT, and outputs the other one as monitoring light to the second optical coupler 22. The second optical coupler 22 branches the monitoring light from the first optical coupler 21 into two lights, outputs one of them to the optical power controller 3, and outputs the other one to the third optical coupler 23. The third optical coupler 23 further branches the monitoring light having been branched by the second optical coupler 22 into two lights, and outputs them to the wavelength controller 4. The branching ratio of the respective optical couplers 21 to 23 may be appropriately set according to the sensitivities of monitoring light reception in the optical power controller 3 and the wavelength controller 4.

The optical power controller 3 has a photodiode (PD) 31, a current-voltage converter (I/V) 32, and an automatic power control circuit (APC) 33. The photodiode 31 receives a monitoring light Lm1 output from the optical coupler 22, and generates an electric current signal, the level of which changes according to the received optical power. The current-voltage converter 32 converts the electric current signal output from the photodiode 31 into an electric voltage signal, and outputs the electric voltage signal to the automatic power control circuit 33. The automatic power control circuit 33 monitors the power of the optical signal Ls output from the light source 11, based on the electric voltage signal from the current-voltage converter 32 and the branching ratio of the optical couplers 21 and 22, and generates a control signal for feedback-controlling the driving electric current of the light source 11 so that the monitored power becomes a pre-set level. The control signal is output to the driving circuit 12 of the light source 11.

The wavelength controller 4, for example, has a first cyclic filter section 41, a second cyclic filter section 42, and a wavelength control circuit 43. The Wavelength control circuit 43 may include a FPGA, ASIC or integrated circuit.

The first cyclic filter section 41 is provided with an etalon filter (EF) 411 serving as a first cyclic filter, to which one monitoring light Lm2 output from the optical coupler 23 is given. This first etalon filter 411 has an optical characteristic in which the transmittance changes cyclically with respect to wavelength (frequency), and is designed so that the cycle (FSR) of the transmission wavelength characteristic becomes a pre-set value. A monitoring light Lm2' having been transmitted through the first etalon filter 411 is given to a photodiode (PD) 412. The photodiode 412 receives the transmitted light Lm2' of the first etalon filter 411, and outputs an electric current signal, the level of which changes according to the received light power, to a current-voltage converter (I/V) 413. The current-voltage converter 413 converts the electric current signal output from the photodiode 412 into an electric voltage signal, and outputs the electric voltage signal to the wavelength control circuit 43. Here, the photodiode 412 and the current-voltage converter 413 function as a first transmitted light power detector.

Moreover, for the first etalon filter 411, there are provided a temperature control element (TEC) 414 and a driving circuit (TEC_DRV) 415 thereof, a temperature monitoring element (TS) 416, and an automatic temperature control circuit (ATC) 417. The temperature control element 414 enables temperature adjustment of the first etalon filter 411. The temperature monitoring element 416 detects the surrounding temperature of the first etalon filter 411, and transmits the detection result to the automatic temperature control circuit 417. The automatic temperature control circuit 417 feedback-controls the driving circuit 415 of the temperature control element 414 so that the temperature detected by the temperature monitoring element 416 becomes constant. Thereby, the transmission wavelength characteristic of the first etalon filter 411 is fixed. Here, the temperature control element 414, the driving circuit 415, the temperature monitoring element 416, and the automatic temperature control circuit 417 function as a transmission wavelength characteristic fixing section.

Here is illustrated a configuration example in which the temperature of the first etalon filter 411 is controlled at a constant temperature by the automatic temperature control circuit 417. However, in those cases where the first etalon filter 411 is configured with use of a material having a low temperature dependency and therefore no substantial change occurs in the transmission wavelength characteristic of the first etalon filter 411 even if the temperature of the first etalon filter 411 changes within the range of operating temperature of the optical transmission device, the temperature control element 414, the driving circuit 415, the temperature monitoring element 416, and the automatic temperature control circuit 417 may be omitted.

The second cyclic filter section 42 is provided with an etalon filter (EF) 421 serving as a second cyclic filter, to which the other monitoring light Lm3 output from the optical coupler 23 is given. This second etalon filter 421, as with the first etalon filter 411 described above, also has an optical characteristic in which the transmittance changes cyclically with respect to wavelength (frequency), and is designed so that the cycle (FSR) of the transmission wavelength characteristic becomes a pre-set value. Here, the FSRs of the first and second etalon filters are set to an equal value.

A monitoring light Lm3' having been transmitted through the second etalon filter 421 is given to a photodiode (PD) 422. The photodiode 422 receives the transmitted light Lm3' of the second etalon filter 421, and outputs an electric current signal, the level of which changes according to the received light power, to a current-voltage converter (I/V) 423. The current-voltage converter 423 converts the electric current signal output from the photodiode 422 into an electric voltage signal, and outputs the electric voltage signal to the wavelength control circuit 43. Here, the photodiode 422 and the current-voltage converter 423 function as a second transmitted light power detector.

Moreover, also for the second etalon filter 421, as with the first etalon filter 411 described above, there are provided a temperature control element (TEC) 424 and a driving circuit (TEC_DRV) 425 thereof, a temperature monitoring element (TS) 426, and an automatic temperature control circuit (ATC) 427. The temperature control element 424 enables temperature adjustment of the second etalon filter 421. The temperature monitoring element 426 detects the surrounding temperature of the second etalon filter 421, and transmits the detection result to the automatic temperature control circuit 427. The automatic temperature control circuit 427, based on the detection result of the temperature monitoring element 426 and the control signal output from the wavelength control circuit 43, generates a signal that variably controls the temperature of the temperature control element 424, and outputs the signal to the driving circuit 425 of the temperature control element 424. Thereby, the temperature of the second etalon filter 421 is variably controlled, and the relative phase relationship of the transmission wavelength characteristics of the first and second etalon filters 411 and 421, is adjusted. Here, the temperature control element 424, the driving circuit 425, the temperature monitoring element 426, and the automatic temperature control circuit 427 function as a transmission wavelength characteristic variable section.

Based on the monitoring temperature of the light source 11 transmitted from the temperature monitoring element 14 of the light source 1, the electric voltage signal output from the current-voltage converter 32 of the optical power controller 3, and the electric voltage signals output from the respective current-voltage converters 413 and 423 of the first and the second cyclic filter sections 41 and 42, the wavelength control circuit 43 variably controls the temperature of the second etalon filter 421 to thereby perform a phase adjustment of the transmission wavelength characteristic, and it performs a feedback control of the temperature of the light source 11, with selective use of the output information of the first and second cyclic filter sections 41 and 42, and pulls-in and stabilizes (locks) the wavelength of the optical signal output from the light source 11 at a target wavelength. Detailed contents of the control of the light source 11 and the second etalon filter 421 performed by this wavelength control circuit 43 are described later.

Next, a control operation in the optical transmission device of the present embodiment is described.

In the optical transmission device of such a configuration as described above, at the stage before an operation of the device is started, there is executed a process of calibrating the relationship between the wavelength and the transmission wavelength characteristics of the first and second etalon filters. Then using the relationship obtained as a result of the calibration process, there is performed a control of the output wavelength of the light source 11 after starting the operation.

Figure 5:
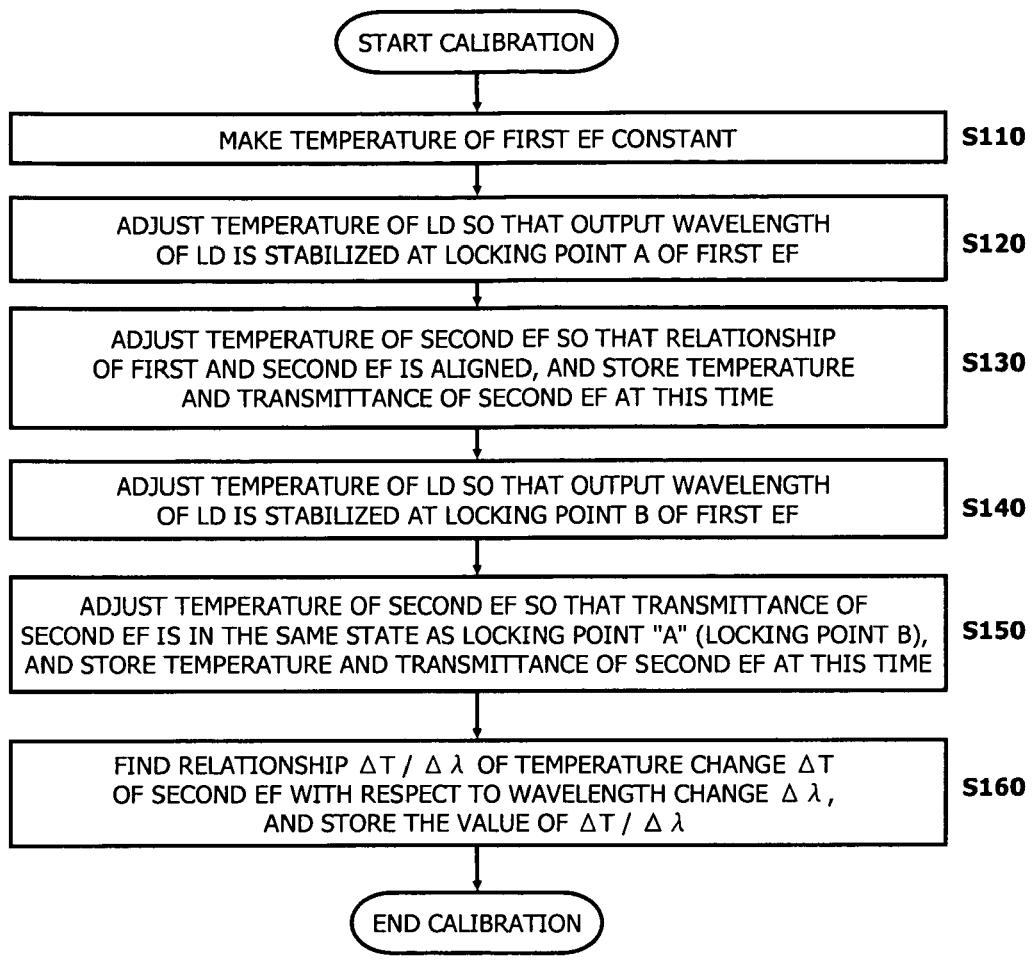
FIG. 5 is a method illustrating a calibration process procedure for before starting operation in the above embodiment.

An example of the calibration process is described, with reference to the method of FIG. 5.

In the calibration process before starting the operation, first, temperature adjustment of the first etalon filter 411 is performed so that the temperature of the first etalon filter 411 becomes constant at a pre-set reference temperature (S110 of FIG. 5). Specifically, the automatic temperature control circuit 417 optimizes the driving state of the temperature control element 414 so that the temperature detected by the temperature monitoring element 416 of the first cyclic filter section 41 becomes constant at a reference temperature such as 25° C.

Figure 6:
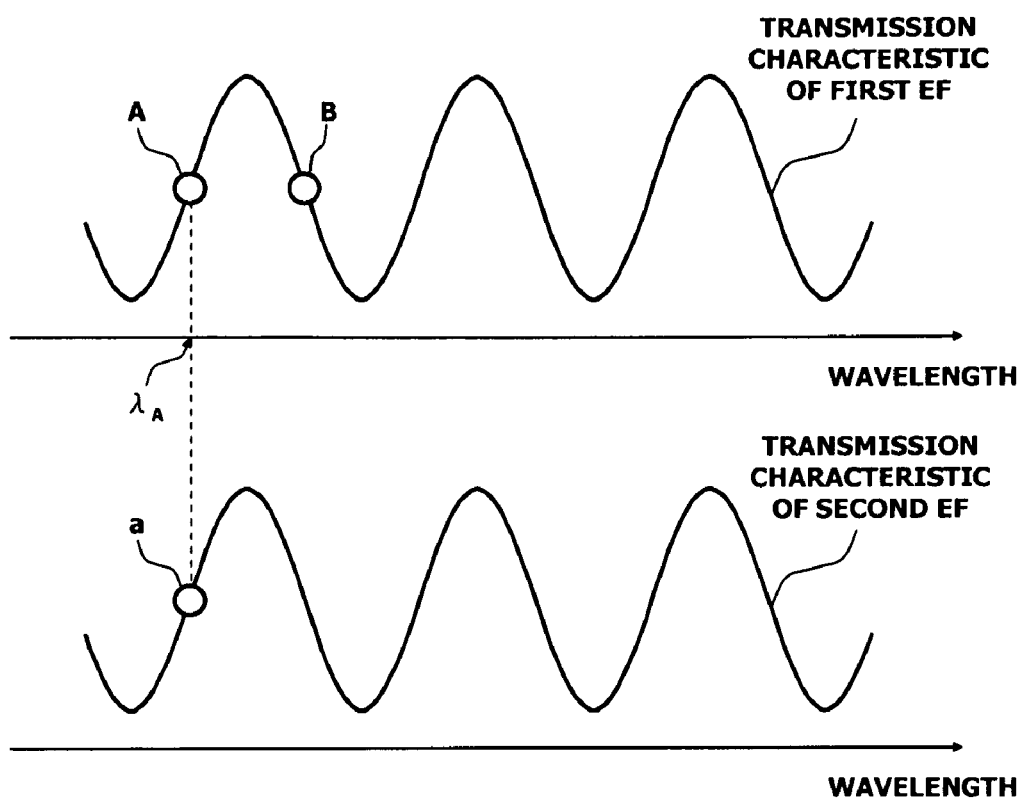
FIG. 6 is a diagram illustrating a state corresponding to a wavelength locking point A, in the calibration process of FIG. 5.

When the first etalon filter 411 becomes constant at the reference temperature, temperature adjustment of the light source 11 is performed by the wavelength control circuit 43 so that the output wavelength of the light source 11 is stabilized at a wavelength locking point of the first etalon filter 411 (S120). For the wavelength locking point of the first etalon filter 411, for example, as illustrated in the upper row of FIG. 6, a first wavelength locking point A is set in the approximate center of the slope portion which rises from the valley to the peak in the cyclic transmission wavelength characteristic of the first etalon filter 411, and a second wavelength locking point B is set in the approximate center of the adjacent slope portion which falls from the peak to the valley. Taking either one of these wavelength locking points A and B set on the slope portions of the first etalon filter 411 as a reference (here the wavelength locking point A is taken as a reference), the wavelength control circuit 43 adjusts the temperature of the light source 11, and thereby the output wavelength of the light source 11 is made a wavelength $\lambda_A$ that corresponds to the wavelength locking point A.

Specifically, in the wavelength control circuit 43, using; the information related to the branching ratio of the respective optical couplers 21 to 23 preliminarily stored in a built-in memory or the like (not illustrated in the diagram), the electric voltage signal output from the current-voltage converter 32 of the optical power controller 3, and the electric voltage signal output from the current-voltage converter 413 of the first cyclic filter section 41, the ratio of the power of the monitoring light Lm2' output from the first etalon filter 411 with respect to the power of the monitoring light Lm2 input to the first etalon filter 411, that is, the transmittance of the first etalon filter 411 is found. Then, the wavelength control circuit 43 optimizes the driving state of the temperature control element 13 of the light source 1 so that this transmittance becomes equal to the transmittance corresponding to the wavelength locking point A of the first etalon filter 411. Thereby the output wavelength of the light source 11 becomes a wavelength $\lambda_A$.

At this time, it is preferable that the power of the optical signal output from the light source 11 be made constant at a pre-set level by feedback-controlling the driving electric current of the light source 11 with the automatic power control circuit 33 of the optical power controller 3. If the output power of the light source 11 is controlled at a constant level, then even if the temperature of the light source 11 is changed by the control of the wavelength control circuit 43, the power of the monitoring light Lm2 input to the first etalon filter 411 becomes constant. Therefore the transmittance of the first etalon filter 411 can be easily found using the output electric voltage of the current-voltage converter 413, and the processing of the wavelength control circuit 43 can be efficiently performed. In the following description, the constant control of the output optical power of the light source 11 is continuously performed by the automatic power control circuit 33 during start up of the optical transmission device. However, even if the output optical power of the light source 11 is not controlled at a constant level, the output wavelength of the light source 11 can be controlled.

When the output wavelength of the light source 11 is locked at the wavelength $\lambda_A$ corresponding to the wavelength locking point A of the first etalon filter 411, temperature adjustment of the second etalon filter 421 is performed so that the relative phase relationship of the transmission wavelength characteristics of the first and second etalon filters 411 and 412 is aligned (S130 of FIG. 5). Specifically, as illustrated in the lower row of FIG. 6, a wavelength locking point "a" is defined in the approximate center of the slope portion which rises from the valley to the peak, of the second etalon filter 421 so as to correspond to the wavelength locking point A of the first etalon filter 411. Then in the wavelength control circuit 43, using; the information related to the branching ratio of the respective optical couplers 21 to 23, the electric voltage signal output from the current-voltage converter 32 of the optical power controller 3, and the electric voltage signal output from the current-voltage converter 423 of the second cyclic filter section 42, the ratio of the power of the monitoring light Lm3' output from the second etalon filter 421 with respect to the power of the monitoring light Lm3 input to the second etalon filter 421 (transmittance) is found. An instruction for adjusting the temperature of the second etalon filter 421 is output from the wavelength control circuit 43 to the temperature control circuit 427 of the second cyclic filter section 42 so that the transmittance of this second etalon filter 421 becomes equal to the transmittance that corresponds to the wavelength locking point "a", and the driving state of the temperature control element 424 is optimized by the temperature control circuit 427. At this time, the wavelength control circuit 43 continues temperature adjustment of the light source 11 using the output information of the first cyclic filter section 41 side, and thereby the output wavelength of the light source 11 is held at the wavelength $\lambda_A$. When the transmittance of the second etalon filter 421 is matched with the wavelength locking point "a", a temperature $T_a$ and transmittance (or an output electric voltage value of the current-voltage converter 423) of the second etalon filter 421 at this time are stored in the built-in memory of the wavelength control circuit 43 while corresponding to the output wavelength $\lambda_A$ of the light source 11.

Subsequently, the wavelength control circuit 43 performs temperature adjustment of the light source 11 so that the output wavelength of the light source 11 is stabilized at the wavelength locking point B adjacent to the wavelength locking point A of the first etalon filter 411 (S140 of FIG. 5). This temperature adjustment of the light source 11 is such that in the wavelength control circuit 43, the temperature of the light source 11 is gradually changed in a direction where the output wavelength becomes longer while monitoring the transmittance of the first etalon filter 411 (or output electric voltage value of the current-voltage converter 413), and when the transmittance becomes a transmittance that corresponds to the wavelength locking point B (basically the same as the transmittance corresponding to the wavelength locking point A) after the increasing state thereof has changed to a decreasing state, the temperature of the light source 11 is made constant in this state. Thereby, the output wavelength of the light source 11, as illustrated in the upper row of FIG. 7, shifts from the wavelength $\lambda_A$ corresponding to the wavelength locking point A of the first etalon filter 411 to the long wavelength side only by $\Delta\lambda$, and becomes a wavelength $\lambda_B$ that corresponds to the wavelength locking point B.

Here is illustrated an example in which the wavelength locking point B is set on the slope portion adjacent to the wavelength locking point A of the first etalon filter 411 with one transmittance maximal peak present therebetween. However, the wavelength locking point B may be set on the slope portion having a slope direction the same as that of the slope portion of the wavelength locking point A, that is to say, it may be set on the slope portion adjacent to a single maximal peak and a single minimal peak of the transmittance. In this case, the temperature adjustment of the light source 11 in the above S140 is performed until the state of the transmittance of the first etalon filter 411 has changed from the increasing state to the decreasing state and further changed to another increasing state and then it has become a transmittance that corresponds to the wavelength locking point B.

Figure 7:
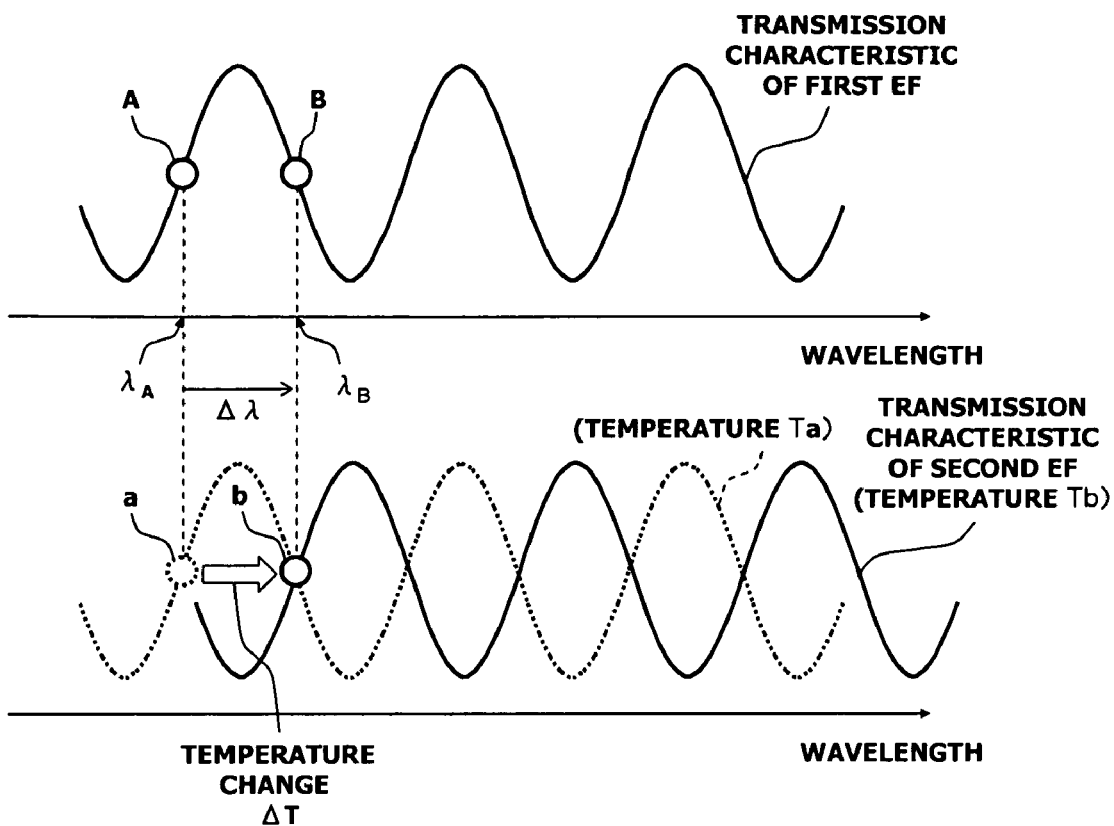
FIG. 7 is a diagram illustrating a state corresponding to a wavelength locking point B, in the calibration process of FIG. 5.

When the output wavelength of the light source 11 is locked at the wavelength $\lambda_B$ corresponding to the wavelength locking point B of the first etalon filter 411, then as illustrated in the lower row of FIG. 7, temperature adjustment of the second etalon filter 421 is performed in the second etalon filter 421 so that a state the same as that at the wavelength locking point "a" described above can be realized at the wavelength $\lambda_B$ (S150 of FIG. 5). That is to say, the temperature of the second etalon filter 421 is adjusted so that the phase of the transmission wavelength characteristic of the second etalon filter 421 is shifted by a ½ cycle with respect to the phase of the transmission wavelength characteristic of the first etalon filter 411 (it is fixed by having the temperature maintained constant by the temperature control circuit 417). In the transmission wavelength characteristic of the second etalon filter 421 (illustrated with a solid line in the lower row of FIG. 7) after temperature adjustment, the point that corresponds to the wavelength locking point 'a" before temperature adjustment is here referred to as a wavelength locking point b.

Specifically, the temperature adjustment of the second etalon filter 421 is such that in the wavelength control circuit 43, the temperature of the second etalon filter 421 is gradually changed in a direction where the transmittance increases, while monitoring the transmittance of the second etalon filter 421 (or the output electric voltage value of the current-voltage converter 423), and when the transmittance has become a transmittance that corresponds to the wavelength locking point "a" after the state thereof has changed from the increasing state to the decreasing state, the temperature of the second etalon filter 421 is made constant in this state. Thereby, the transmission wavelength characteristic of the second etalon filter 421 is brought to a state where the phase thereof is shifted by a ½ cycle with respect to the transmission wavelength characteristic of the first etalon filter 411. The temperature $T_b$ and the transmittance of the second etalon filter 421 at this time (or the output electric voltage value of the current-voltage converter 423) is stored in the built-in memory of the wavelength control circuit 43 while corresponding to the output wavelength $\lambda_B$ of the light source 11.

Subsequently, making reference to the stored information in the built-in memory, the wavelength control circuit 43 finds a relationship $\Delta T/\Delta\lambda$ of a change in the temperature of the second etalon filter 421 $\Delta T (=T_b-T_a)$ with respect to a change in the output wavelength of the light source 11 $\Delta\lambda (=\lambda_B-\lambda_A)$, and stores the value of this $\Delta T/\Delta\lambda$ in the built-in memory (S160 of FIG. 5). By performing the series of processes above, the calibration before starting the operation is completed.

Figure 8:
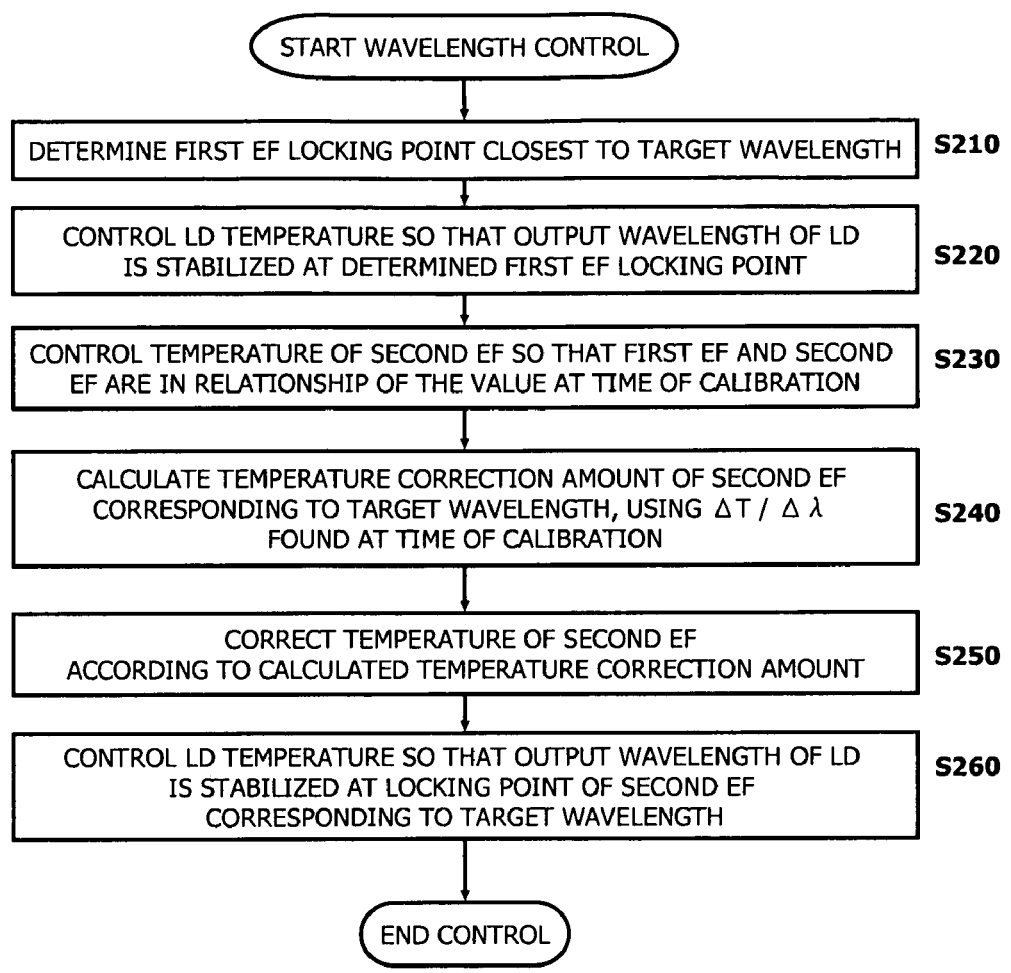
FIG. 8 is a method illustrating a wavelength control procedure for after starting operation in the above embodiment.

Next, an example of wavelength control after starting the operation is described, with reference to the method of FIG. 8.

Having performed the calibration process described above and started the operation of the optical transmission device, first, in the wavelength control circuit 43, among a plurality of wavelength locking points that may be set for the first etalon filter 411, a wavelength locking point of a wavelength closest to the target wavelength $\lambda_T$ instructed from outside (reference wavelength locking point) is determined (S210 of FIG. 8). Specifically, for example as illustrated in the upper row of FIG. 9, in a case where wavelength locking points A, B, C, and so on are set on respective slope portions which rise from the valley to the peak and fall from the peak to the valley in the transmission wavelength characteristic of the first etalon filter 411, and the target wavelength $\lambda_T$ is positioned between the wavelength locking points A and B and in the vicinity of the wavelength locking point A, the wavelength control circuit 43 determines that the wavelength locking point that is closest to the target wavelength $\lambda_T$ is the point A, since the relationship $\lambda_T<(\lambda_A+\lambda_B)/2$ is true.

Figure 9:
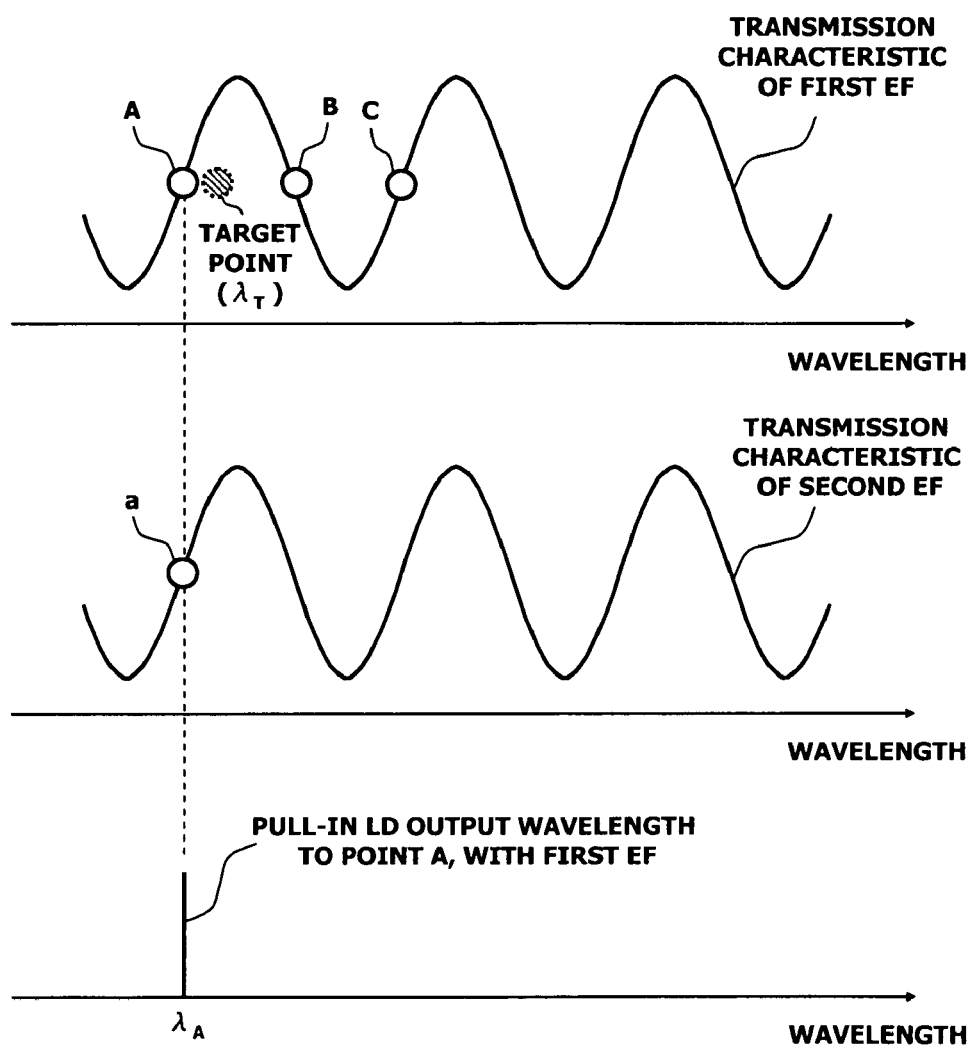
FIG. 9 is a diagram illustrating a control state in a first half in a case where a target wavelength is positioned in the vicinity of the wavelength locking point A, in the wavelength control of FIG. 8.

Subsequently, the wavelength control circuit 43 controls the temperature of the light source 11 so that the output wavelength of the light source 11 is stabilized at the determined wavelength locking point A (S220 of FIG. 8). This temperature control of the light source 11 is such that having controlled the temperature of the first etalon filter 411 to be constant at the reference temperature with the temperature control circuit 417 of the first cyclic filter section 41, the wavelength control circuit 43 makes a coarse adjustment to the driving state of the temperature control element 13 of the light source 1, so that the output wavelength of the light source 11 falls inside the pull-in range including the wavelength locking point A of the first etalon filter 411, that is, the wavelength range between the minimal peak and the maximal peak adjacent to the wavelength locking point A. Then the wavelength control circuit 43 monitors the transmittance of the first etalon filter 411 (or the output electric voltage value of the current-voltage converter 413), and feedback-controls the driving state of the temperature control element 13 of the light source 1, so that the transmittance matches with the transmittance that corresponds to the wavelength locking point A. Thereby, the output wavelength of the light source 11, as illustrated in the lower row of FIG. 9, is pulled-in to the wavelength $\lambda_A$ that corresponds to the wavelength locking point A of the first etalon filter 411. At this time, the power of the optical signal output from the light source 11 is preferably controlled to be constant at a required level by the automatic power control circuit 33 of the optical power controller 3.

When the output wavelength of the light source 11 has been pulled-in to $\lambda_A$, the wavelength control circuit 43 makes a reference to the stored information in the built-in memory, and controls the temperature of the second etalon filter 421 at $T_a$, so that the relative phase relationship of the transmission wavelength characteristics of the first and second etalon filters 411 and 412 becomes a relationship the same as that for the wavelength $\lambda_A$ at the time of calibration (S230 of FIG. 8). Thereby, as illustrated in the upper row and middle row of FIG. 9, the relative phase relationship of the transmission wavelength characteristics of the first and second etalon filters 411 and 421 is aligned.

Next, from the stored information of the built-in memory, the wavelength control circuit 43 reads the relationship $\Delta T/\Delta\lambda$ of the temperature change of the second etalon filter 421 with respect to the wavelength change found in the calibration, and calculates a temperature correction amount $\Delta T_a$ of the second etalon filter 421 corresponding to the target wavelength $\lambda_T$, using the relationship $\Delta T_a=(\Delta T/\Delta\lambda)\times(\lambda_T-\lambda_A)$ (S240 of FIG. 8).

When the temperature correction amount $\Delta T_a$ of the second etalon filter 421 has been calculated, the wavelength control circuit 43 controls the driving state of the temperature control element 424 of the second cyclic filter section 42 according to the temperature correction amount $\Delta T_a$, so that the temperature of the second etalon filter 421 becomes $T_a+\Delta T_a$ (S250 of FIG. 8). Thereby, as illustrated with the solid line in the middle row of FIG. 10, the transmission wavelength characteristic of the second etalon filter 421 shifts to the long wavelength side, and the wavelength locking point "a" before the temperature correction shifts to a wavelength locking point a' that corresponds to the target wavelength $\lambda_T$. During the temperature control of the second etalon filter 421 in the above S230 and S250, the output wavelength of the light source 11 is locked at the wavelength $\lambda_A$ that corresponds to the wavelength locking point A of the first etalon filter 411, by continuing the temperature control of the light source 11 that uses the output information of the first cyclic filter section 41 in the above S220.

Figure 10:
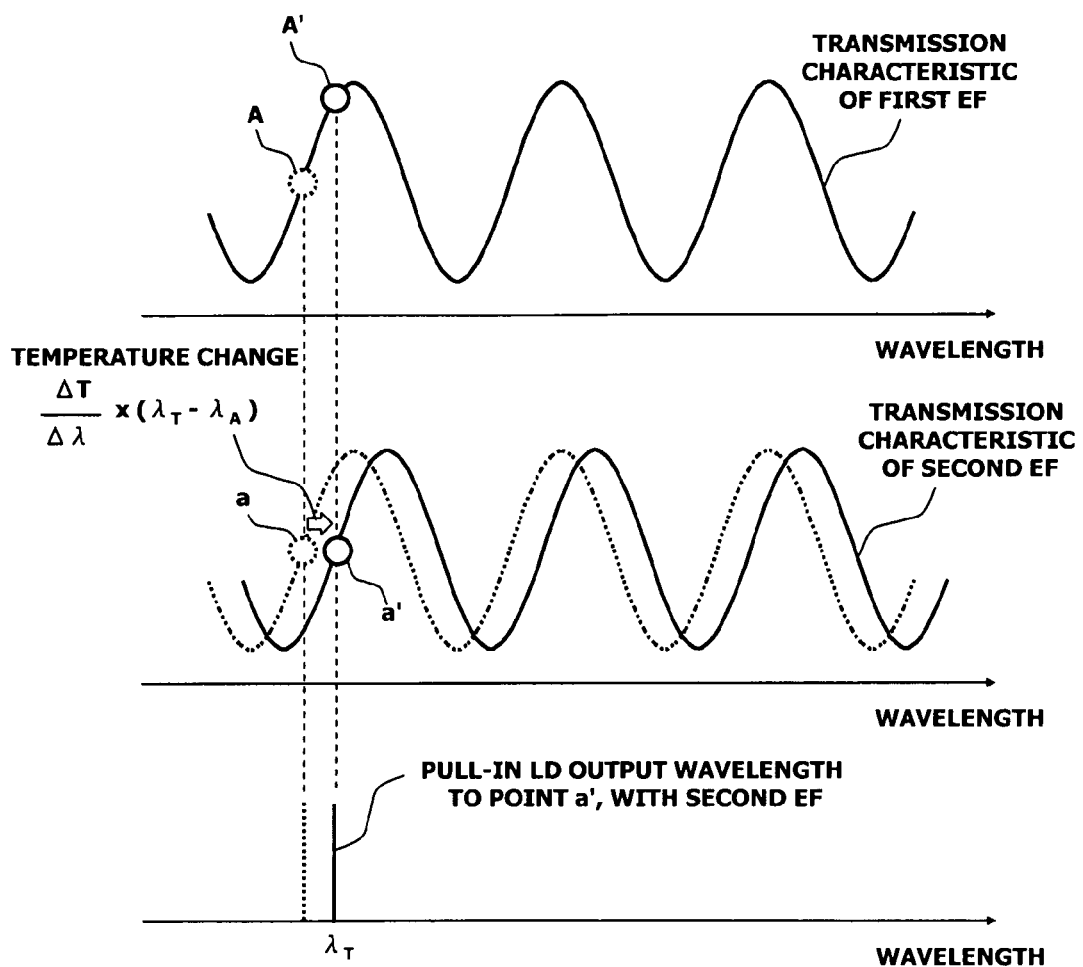
FIG. 10 is a diagram illustrating a control state in a second half in the case where a target wavelength is positioned in the vicinity of the wavelength locking point A, in the wavelength control of FIG. 8.

When the temperature of the second etalon filter 421 has been stabilized at $T_a+\Delta T_a$, the wavelength control circuit 43 switches from the temperature control of the light source 11 that uses the output information of the first cyclic filter section 41, to the temperature control of the light source 11 that uses the output information of the second cyclic filter section 42. That is to say, the wavelength control circuit 43 monitors the transmittance of the second etalon filter 421 (or the output electric voltage value of the current-voltage converter 423), and feedback-controls the driving state of the temperature control element 13 of the light source 1, so that the transmittance matches with the transmittance that corresponds to the wavelength locking point a' (transmittance the same as that corresponding to the wavelength locking point "a"). Thereby, the output wavelength of the light source 11, as illustrated in the lower row of FIG. 10, is pulled-in to the target wavelength $\lambda_T$ that corresponds to the wavelength locking point a' of the second etalon filter 421. At this time, the transmittance of the first etalon filter 411 becomes in the vicinity of the maximal peak thereof as illustrated with the point A' in the upper row of FIG. 10. However, since the temperature control of the light source 11 has been switched to the second cyclic filter section 42 side, the control precision of the output wavelength of the light source 11 will not be reduced.

Figure 13:
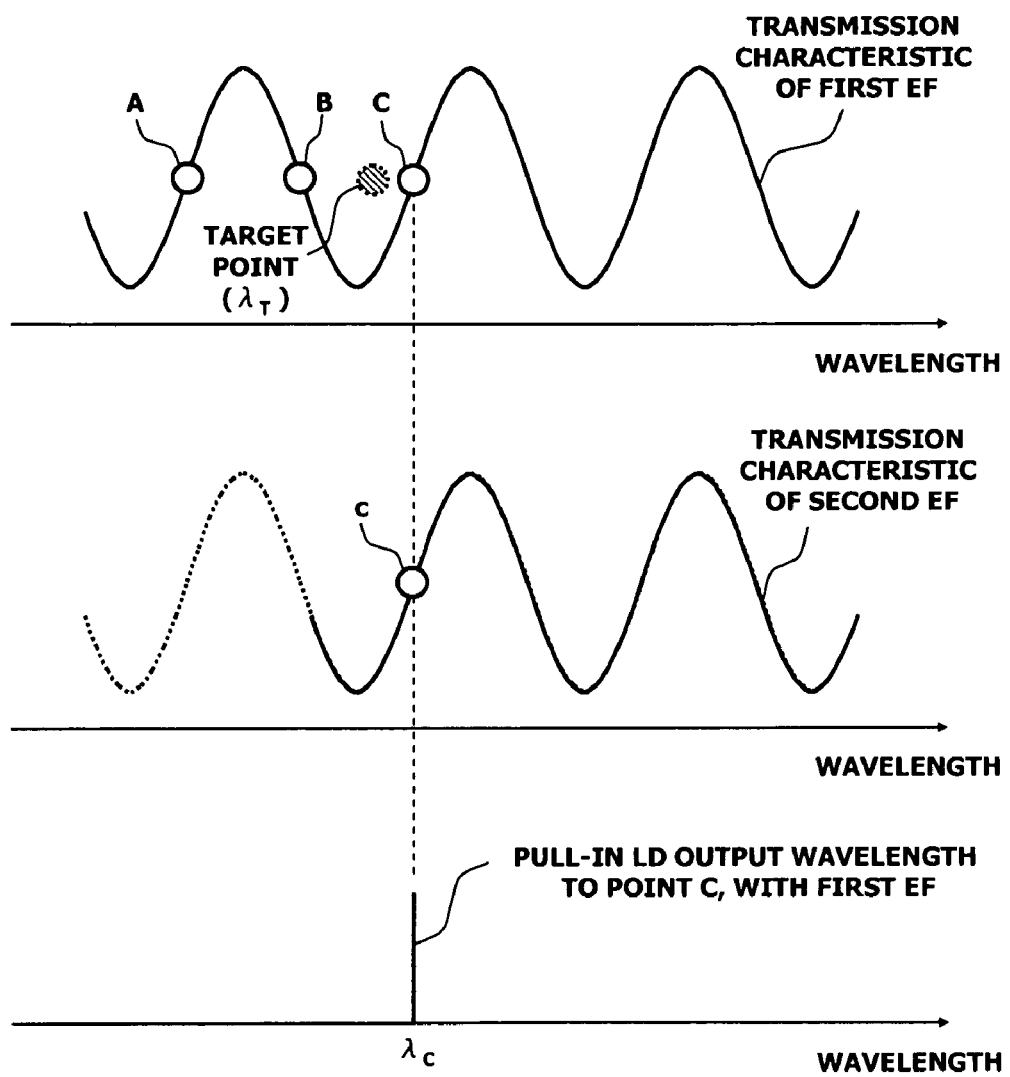
FIG. 13 is a diagram illustrating a control state in a first half in a case where a target wavelength is positioned in the vicinity of the wavelength locking point C, in the wavelength control of FIG. 8.
Figure 14:
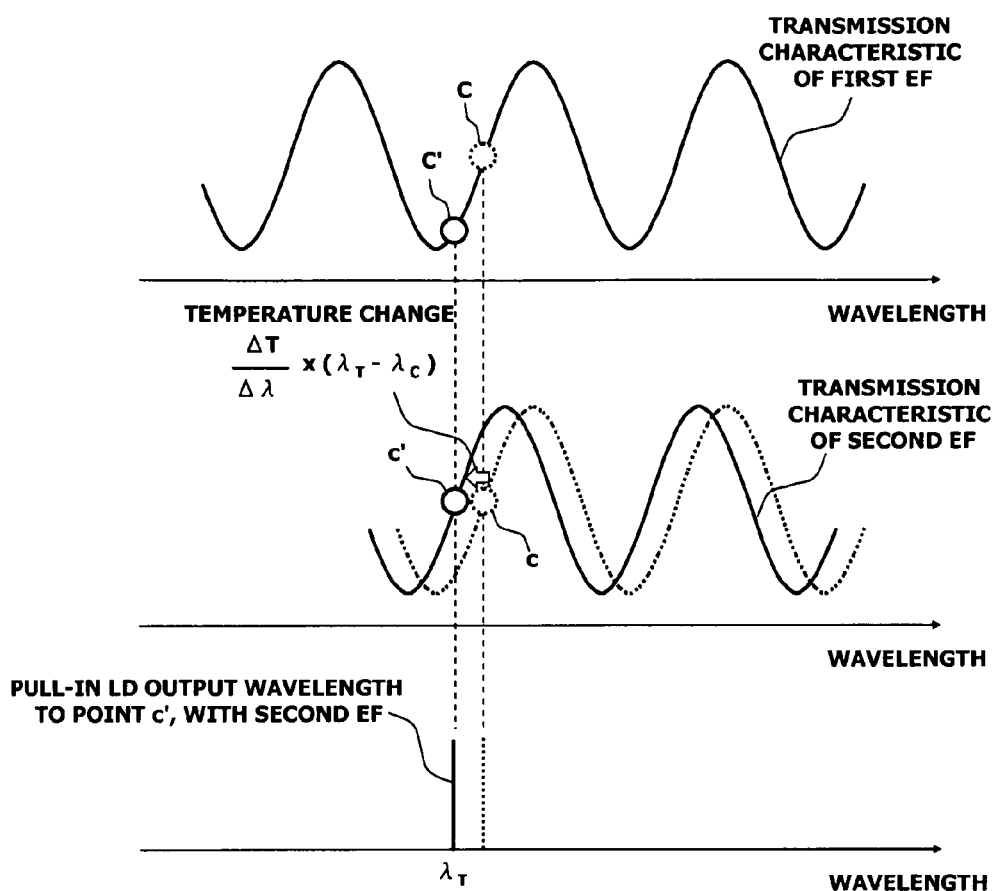
FIG. 14 is a diagram illustrating a control state in a second half in a case where a target wavelength is positioned in the vicinity of the wavelength locking point C, in the wavelength control of FIG. 8.

In the above description of the wavelength control after starting the operation, an example is given of the case where the target wavelength $\lambda_T$ is closest to the wavelength locking point A of the first etalon filter 411. However, even in other cases, the output wavelength of the light source 11 can be controlled to the target wavelength $\lambda_T$, according to a procedure basically similar to that in the above case. Here, as another example, there are described; a case where the target wavelength $\lambda_T$ is positioned between the wavelength locking points B and C of the first etalon filter 411 and on the side close to the wavelength locking point B (FIG. 11 and FIG. 12), and a case where it is positioned on the side close to the wavelength locking point C (FIG. 13 and FIG. 14).

Figure 11:
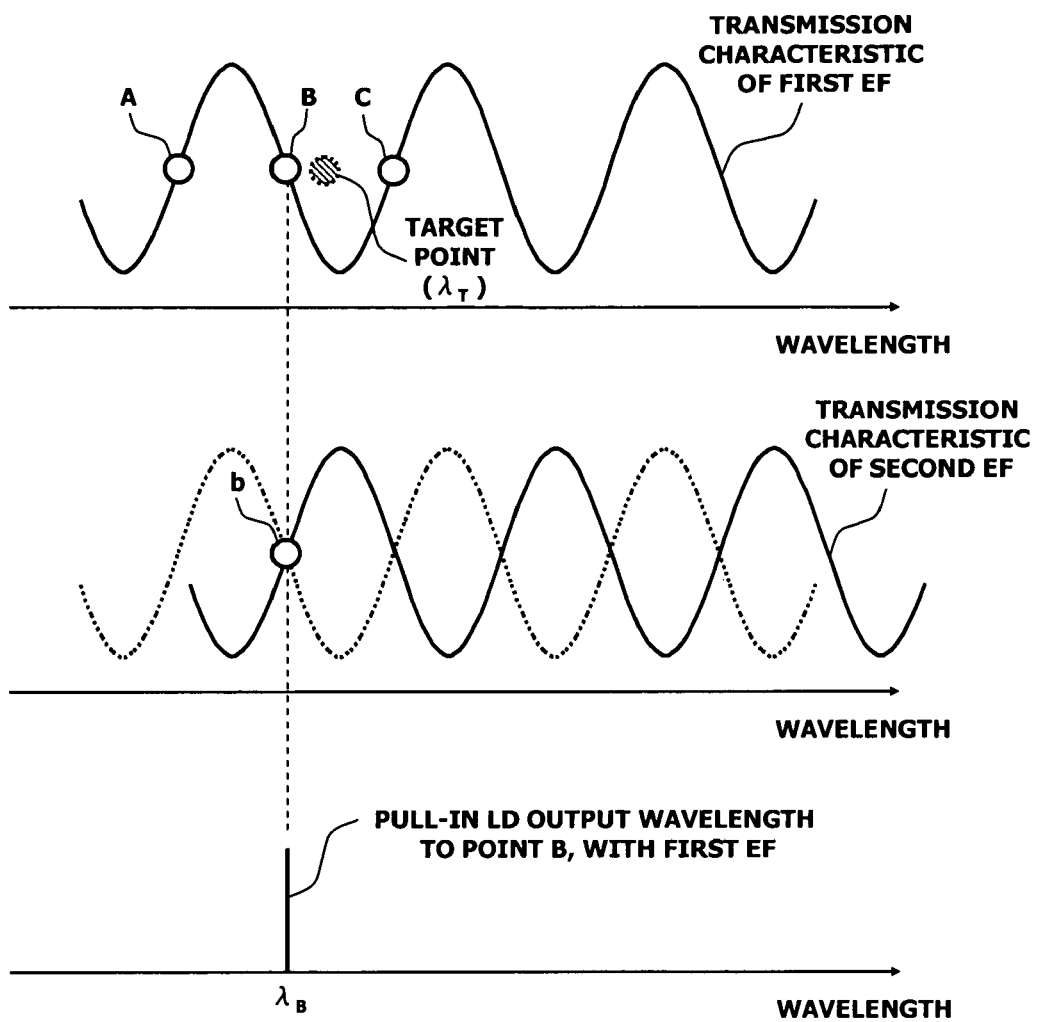
FIG. 11 is a diagram illustrating a control state in a first half in a case where a target wavelength is positioned in the vicinity of the wavelength locking point B, in the wavelength control of FIG. 8.

In the case where the target wavelength $\lambda_T$ is positioned on the side close to the wavelength locking point B as illustrated in the upper row of FIG. 11, in the process of S210 of FIG. 8, the wavelength control circuit 43 determines that the wavelength locking point that is closest to the target wavelength $\lambda_T$ is the point B, since the relationship $\lambda_T<(\lambda_B+\lambda_C)/2$ is true. Then in the process of S220, the wavelength control circuit 43 performs temperature control of the light source 11 so that the output wavelength of the light source 11 is stabilized at the wavelength locking point B. Moreover, in the process of S230, the wavelength control circuit 43 controls the temperature of the second etalon filter 421 to a temperature $T_b$, so that the relative phase relationship of the transmission wavelength characteristics of the first and second etalon filters 411 and 412 becomes a relationship the same as that for the wavelength $\lambda_B$ at the time of calibration, that is, a relationship where the relative phase is shifted by a ½ cycle as illustrated with the solid line in the middle row of FIG. 11.

Furthermore, in the process of S240 of FIG. 8, the wavelength control circuit 43 calculates a temperature correction amount $\Delta T_b$ of the second etalon filter 421 corresponding to the target wavelength $\lambda_T$, using the relationship $\Delta T_b=(\Delta T/\Delta\lambda)\times(\lambda_T-\lambda_B)$. Note, the relationship $\Delta T/\Delta\lambda$ assumes that no significant errors occur between the wavelength locking points A and B, as well as between the wavelength locking points B and C, and the like. In a case where a significant error occurs, then at the time of calibration, the relationship $\Delta T/\Delta\lambda$ is found and stored for each portion between the adjacent wavelength locking points of the first etalon filter 411.

Figure 12:
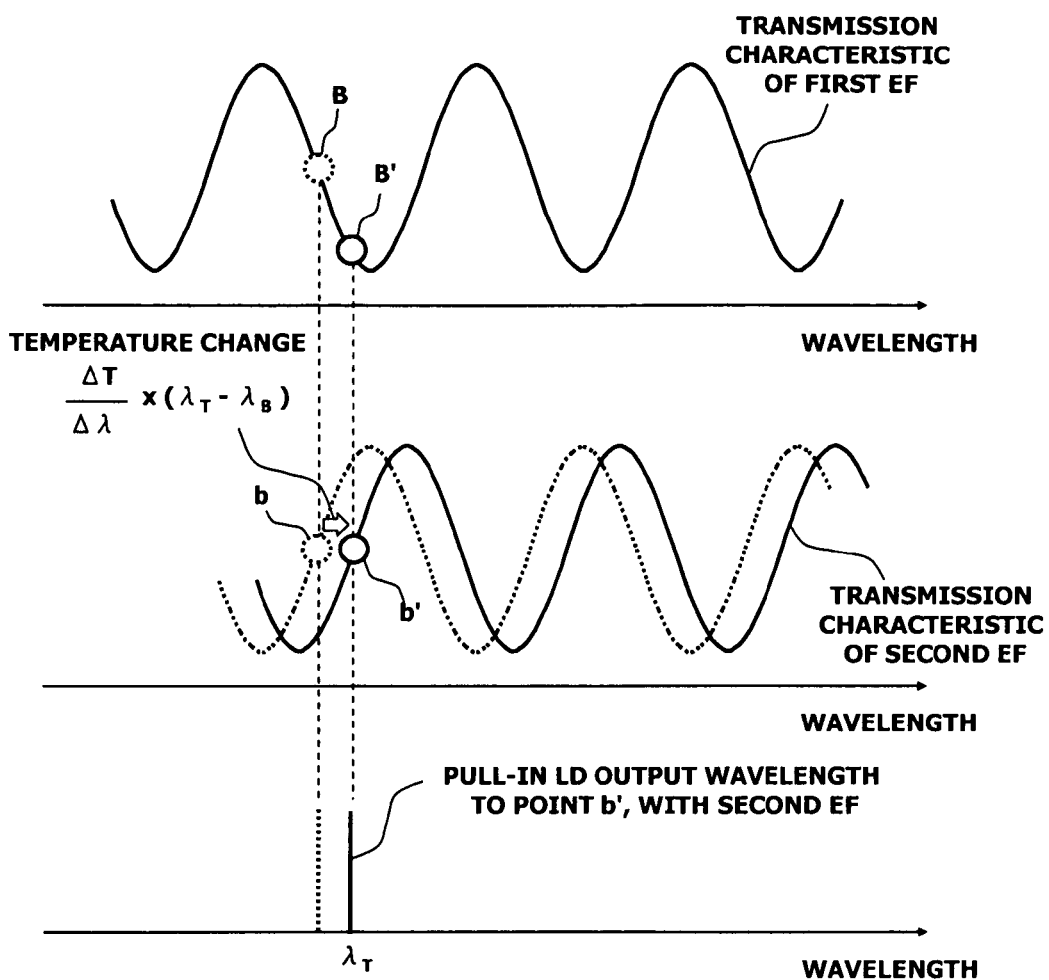
FIG. 12 is a diagram illustrating a control state in a second half in the case where a target wavelength is positioned in the vicinity of the wavelength locking point B, in the wavelength control of FIG. 8.

Then in the process of S250 of FIG. 8, the temperature of the second etalon filter 421 is corrected to a temperature $T_b+\Delta T_b$, and thereby, as illustrated with the solid line in the middle row of FIG. 12, the transmission wavelength characteristic of the second etalon filter 421 shifts to the long wavelength side, and the wavelength locking point b before the temperature correction, shifts to the wavelength locking point b' that corresponds to the target wavelength $\lambda_T$. Finally, in the process of S260, the temperature control of the light source 11 is switched to the control that uses the output information of the second cyclic filter section 42, and thereby, as illustrated in the lower row of FIG. 12, the output wavelength of the light source 11 is pulled-in to the target wavelength $\lambda_T$ that corresponds to the wavelength locking point b' of the second etalon filter 421.

On the other hand, in the case where the target wavelength $\lambda_T$ is positioned on the side close to the wavelength locking point C as illustrated in the upper row of FIG. 13, in the process of S210 of FIG. 8, the wavelength control circuit 43 determines that the wavelength locking point that is closest to the target wavelength $\lambda_T$ is the point C, since the relationship $\lambda_T\geq(\lambda_B+\lambda_C)/2$ is true. Then in the process of S220, the wavelength control circuit 43 performs temperature control of the light source 11 so that the output wavelength of the light source 11 is stabilized at the wavelength locking point C. Moreover, in the process of S230, the wavelength control circuit 43 performs temperature control of the second etalon filter 421, so that the relative phase relationship of the transmission wavelength characteristics of the first and second etalon filters 411 and 412 becomes a relationship of being shifted by twofold from the state of the wavelength $\lambda_B$ at the time of calibration, that is, a relationship where the relative phase is shifted by one cycle as illustrated with the solid line in the middle row of FIG. 13. Here, the temperature of the second etalon filter 421 at this time is $T_c$.

Furthermore, in the process of S240 of FIG. 8, the wavelength control circuit 43 calculates a temperature correction amount $\Delta T_c$ of the second etalon filter 421 corresponding to the target wavelength $\lambda_T$, using the relationship $\Delta T_c=(\Delta T/\Delta\lambda)\times(\lambda_T-\lambda_c)$. Here, since $\lambda_T<\lambda_c$, the sign of the temperature correction amount $\Delta Tc$ becomes a reversed sign of the temperature correction values $\Delta T_a$ and $\Delta T_b$ described above.

Then in the process of S250 of FIG. 8, the temperature of the second etalon filter 421 is corrected to a temperature $T_b+\Delta T_c$, and thereby, as illustrated with the solid line in the middle row of FIG. 14, the transmission wavelength characteristic of the second etalon filter 421 shifts to the short wavelength side, and the wavelength locking point c before the temperature correction shifts to the wavelength locking point c' that corresponds to the target wavelength $\lambda_T$. Finally, in the process of S260, the temperature control of the light source 11 is switched to the control that uses the output information of the second cyclic filter section 42, and thereby, as illustrated in the lower row of FIG. 14, the output wavelength of the light source 11 is pulled-in to the target wavelength $\lambda_T$ that corresponds to the wavelength locking point c' of the second etalon filter 421.

According to the optical transmission device of the present embodiment as described above, the first etalon filter 411, the transmission wavelength characteristic of which is fixed in order to obtain a reference position of wavelength control, and the second etalon filter 421, the transmission wavelength characteristic of which is made variable in order to change the relative phase relationship with respect to the transmission wavelength characteristic of the first etalon filter 411 according to the target wavelength $\lambda_T$, are combined to thereby perform wavelength control. Consequently it is possible, with a simple configuration using a combination of these two etalon filters, to lock the output wavelength of the light source 11 at arbitrary wavelengths at a high level of precision. Accordingly, it is possible to easily realize a multigrid capable optical transmission device at low cost.

Here, multigrid handling of the above optical transmission device is described in detail, giving a specific working example. The following description assumes a case where for the first and second etalon filters 411 and 412 of the optical transmission device, ones that are designed for 100 GHz FSR are applied, and wavelength control that is capable of handling wavelength intervals of for example 50 GHz and 37.5 GHz is performed.

Figure 15:
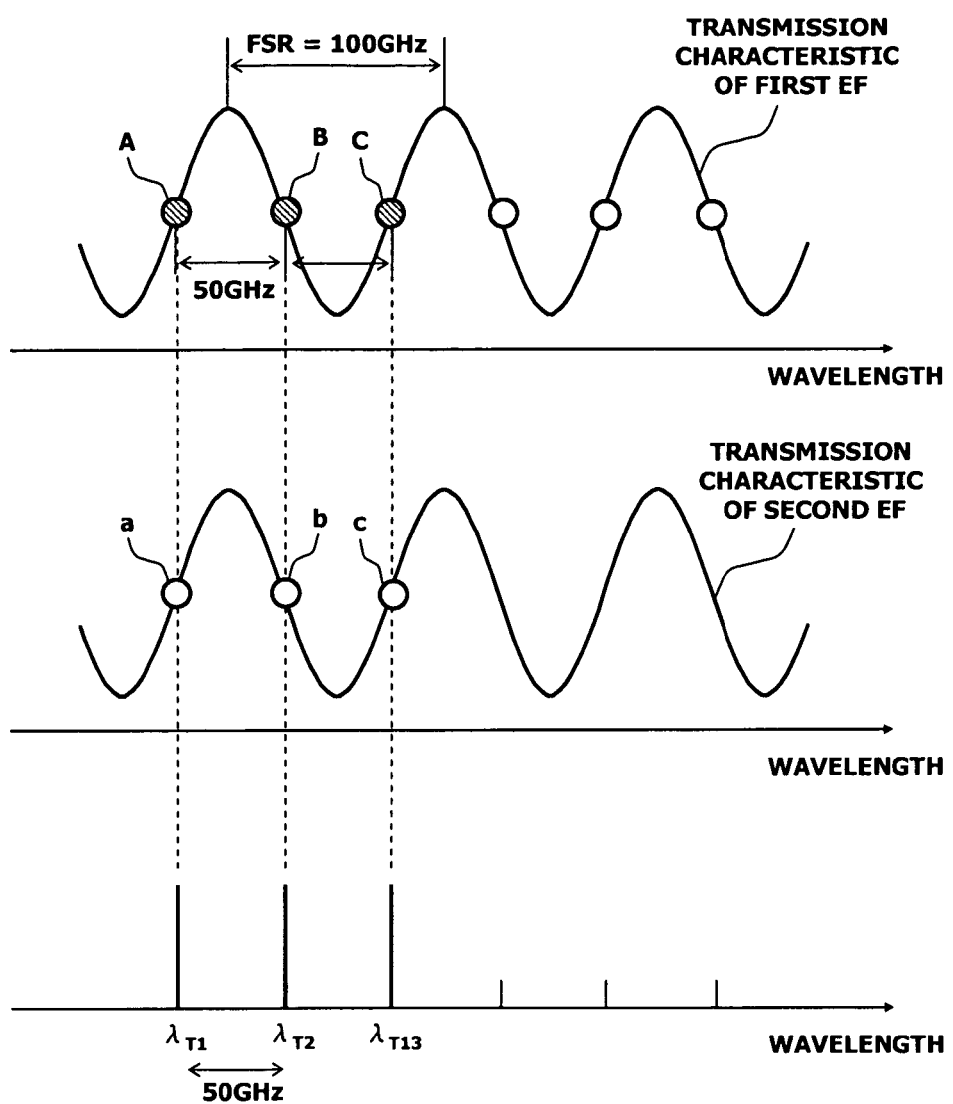
FIG. 15 is a diagram illustrating a control state where, in specific working examples of the above embodiment, they are made capable of handling wavelength intervals of 50 GHz.

In the working example of the optical transmission device, wavelength locking points A, B, C, and so on that may be set with respect to the first etalon filter 411 of 100 GHz FSR, are of 50 GHz wavelength intervals as illustrated in the upper row of FIG. 15. Therefore, at the stage before starting the operation of the optical transmission device, a calibration process is performed in advance for the wavelength locking points A and B of the first etalon filter 411 and the wavelength locking points "a" and b of the second etalon filter 421 as with the case illustrated in FIG. 5 to FIG. 7 described above.

Then for 50 GHz wavelength intervals, the temperature control of the light source 11 that uses the output information of the first cyclic filter section 41 is performed, since the intervals of the target wavelength matches with the wavelength intervals of the respective wavelength locking points of the first and second etalon filters 411 and 412. Alternatively the temperature of the second etalon filter 421 is controlled in advance to a temperature $T_a$, so that the relative phase of the transmission wavelength characteristics of the first and second etalon filters 411 and 421 is aligned, and then the temperature control of the light source 11 that uses the output information of the second cyclic filter section 42 is performed. Thereby, as illustrated in the lower row of FIG. 15, the output wavelength of the light source 11 can be locked on any of the wavelengths $\lambda_{T1}, \lambda_{T2}, \lambda_{T3}$, and so on on the grid of 50 GHz intervals. For example, in the case illustrated in the lower row of FIG. 15 where the wavelength $\lambda_{T1}$ is the target wavelength, after having coarse-adjusted the temperature of the light source 11 so that the output wavelength of the light source 11 falls in a pull-in range including the wavelength locking point A (or "a"), there is performed a feedback control of the temperature of the light source 11 that uses the output information of the first cyclic filter section 41 or the second cyclic filter section 42. Moreover, in a case where other wavelengths $\lambda_{T2}, \lambda_{T3}$, and so on are the target wavelength, then as with the case described above, after having coarse-adjusted the temperature of the light source 11 so that the output wavelength of the light source 11 falls in a pull-in range including the wavelength locking point corresponding to the target wavelength, there is performed a feedback control of the temperature of the light source 11 that uses the output information of the first cyclic filter section 41 or the second cyclic filter section 42.

Figure 16:
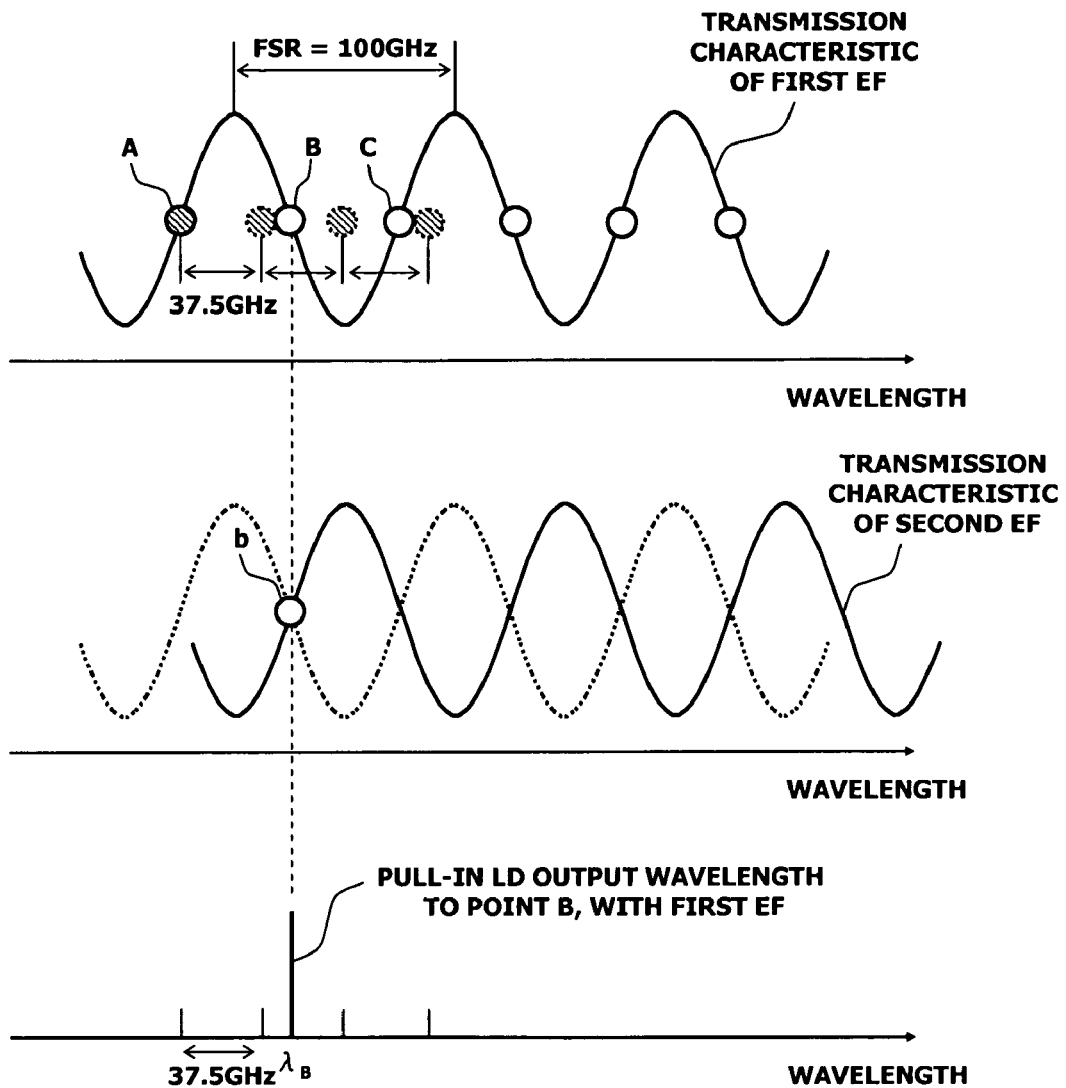
FIG. 16 is a diagram illustrating a control state in a first half in a case where the wavelength is locked at $\lambda_{T1}$ with respect to the wavelength intervals of 37.5 GHz, in the above embodiment.

On the other hand, for 37.5 GHz wavelength intervals, as illustrated in the upper row of FIG. 16, since the intervals of the target wavelength become ¾ with respect to the intervals of the wavelength locking points A, B, C, and so on of the first etalon filter 411, it is necessary to optimize the relative phase relationship of the transmission wavelength characteristics of the first and second etalon filters 411 and 421 according to the target wavelength, and thereby control the output wavelength of the light source 11.

For example, in a case where the target wavelength is away by 37.5 GHz to the long wavelength side from the wavelength locking point A of the first etalon filter 411, the wavelength locking point of the first etalon filter 411 that is closest to the target wavelength becomes the point B. Consequently, after having performed the temperature control of the light source 11 using the output information of the first cyclic filter section 41 and pulled-in the output wavelength of the light source 11 to the wavelength $\lambda_B$ corresponding to the wavelength locking point B (lower row of FIG. 16), the temperature of the second etalon filter 421 is brought to a temperature $T_b$ (middle row of FIG. 16) so that the relative phase relationship of the transmission wavelength characteristics of the first and second etalon filters 411 and 421 becomes a relationship the same as that for the wavelength $\lambda_B$ at the time of calibration.

Figure 17:
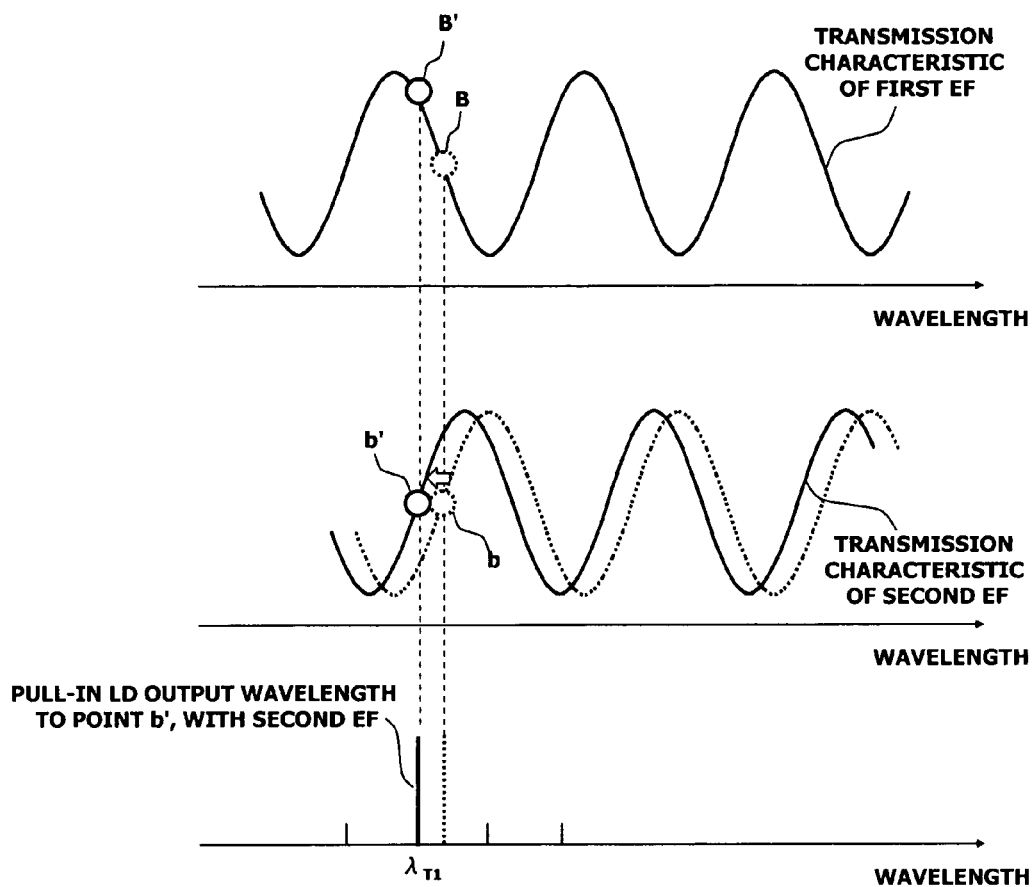
FIG. 17 is a diagram illustrating a control state in a second half in the case where the wavelength is locked at $\lambda^{T1}$ with respect to the wavelength intervals of 37.5 GHz, in the above embodiment.

Then, the temperature correction amount $\Delta T_b$ of the second etalon filter 421 corresponding to the target wavelength is calculated using $\Delta T/\Delta\lambda$ obtained at the time of calibration, and the temperature of the second etalon filter 421 is corrected to a temperature $T_b+\Delta T_b$. Thereby, as illustrated in the middle row of FIG. 17, the transmission wavelength characteristic of the second etalon filter 421 shifts by 12.5 GHz to the short wavelength side, and the wavelength locking point b before the temperature correction shifts to the wavelength locking point b' that corresponds to the target wavelength. By performing temperature control of the light source 11 with this wavelength locking point b' of the second etalon filter 421 serving as a reference, then as illustrated in the lower row of FIG. 17, the output wavelength of the light source 11 is locked at the wavelength $\lambda_{T1}$ on the grid of 37.5 GHz intervals.

Figure 18:
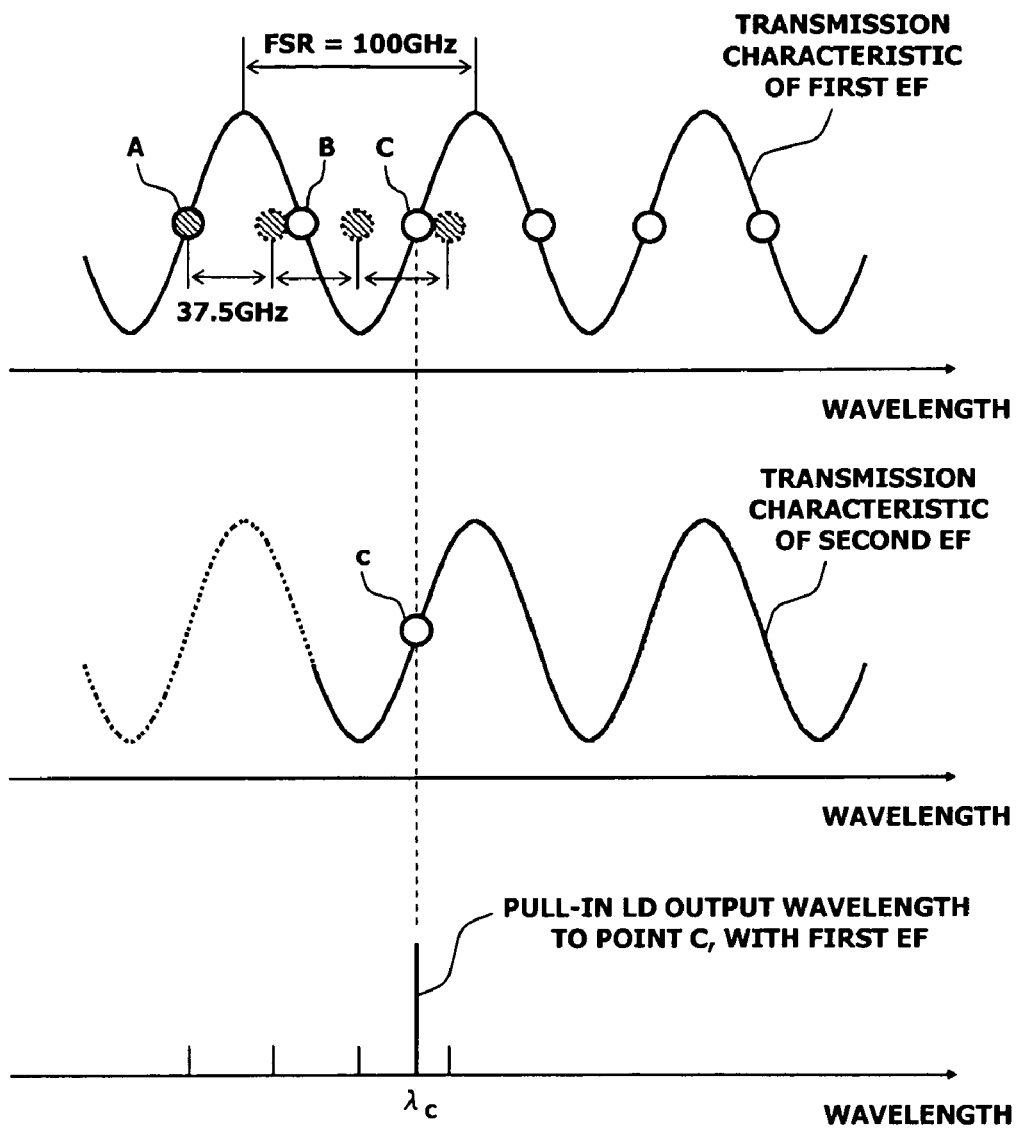
FIG. 18 is a diagram illustrating a control state in a first half in a case where the wavelength is locked at $\lambda_{T2}$ or $\lambda_{T3}$ with respect to the wavelength intervals of 37.5 GHz, in the above embodiment.

Moreover, as illustrated for example in the upper row of FIG. 18, in a case where the target wavelength is away by 37.5 GHz×2=75 GHz to the long wavelength side from the wavelength locking point A of the first etalon filter 411, the wavelength locking point of the first etalon filter 411 that is closest to the target wavelength is the point C. Consequently, after having performed the temperature control of the light source 11 using the output information of the first cyclic filter section 41, and pulled-in the output wavelength of the light source 11 to the wavelength $\lambda_C$ corresponding to the wavelength locking point C (lower row of FIG. 18), the control temperature of the second etalon filter 421 is performed (middle row of FIG. 18) so that the relative phase relationship of the transmission wavelength characteristics of the first and second etalon filters 411 and 421 becomes a relationship shifted twice, that is by one cycle, from the state of the wavelength $\lambda_B$ at the time of calibration.

Figure 19:
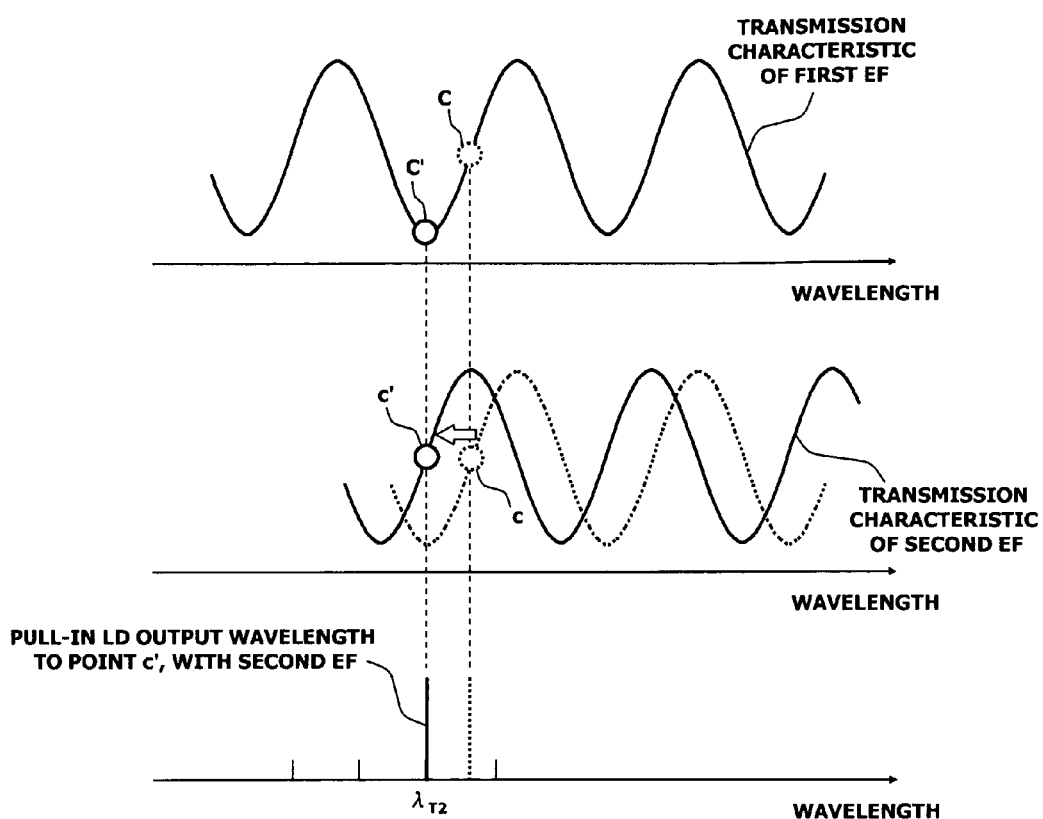
FIG. 19 is a diagram illustrating a control state in a second half in a case where the wavelength is locked at $\lambda_{T2}$ with respect to the wavelength intervals of 37.5 GHz, in the above embodiment.

Then, the temperature correction amount $\Delta T_c$ of the second etalon filter 421 corresponding to the target wavelength is calculated using $\Delta T/\Delta\lambda$ obtained at the time of calibration, and the temperature of the second etalon filter 421 is corrected to a temperature $T_c+\Delta T_c$. Thereby, as illustrated in the middle row of FIG. 19, the transmission wavelength characteristic of the second etalon filter 421 shifts by 25 GHz to the short wavelength side, and the wavelength locking point c before the temperature correction shifts to the wavelength locking point c' that corresponds to the target wavelength. By performing temperature control of the light source 11 with this wavelength locking point c' of the second etalon filter 421 serving as a reference, then as illustrated in the lower row of FIG. 19, the output wavelength of the light source 11 is locked at the wavelength $\lambda_{T2}$ on the grid of 37.5 GHz intervals.

Figure 20:
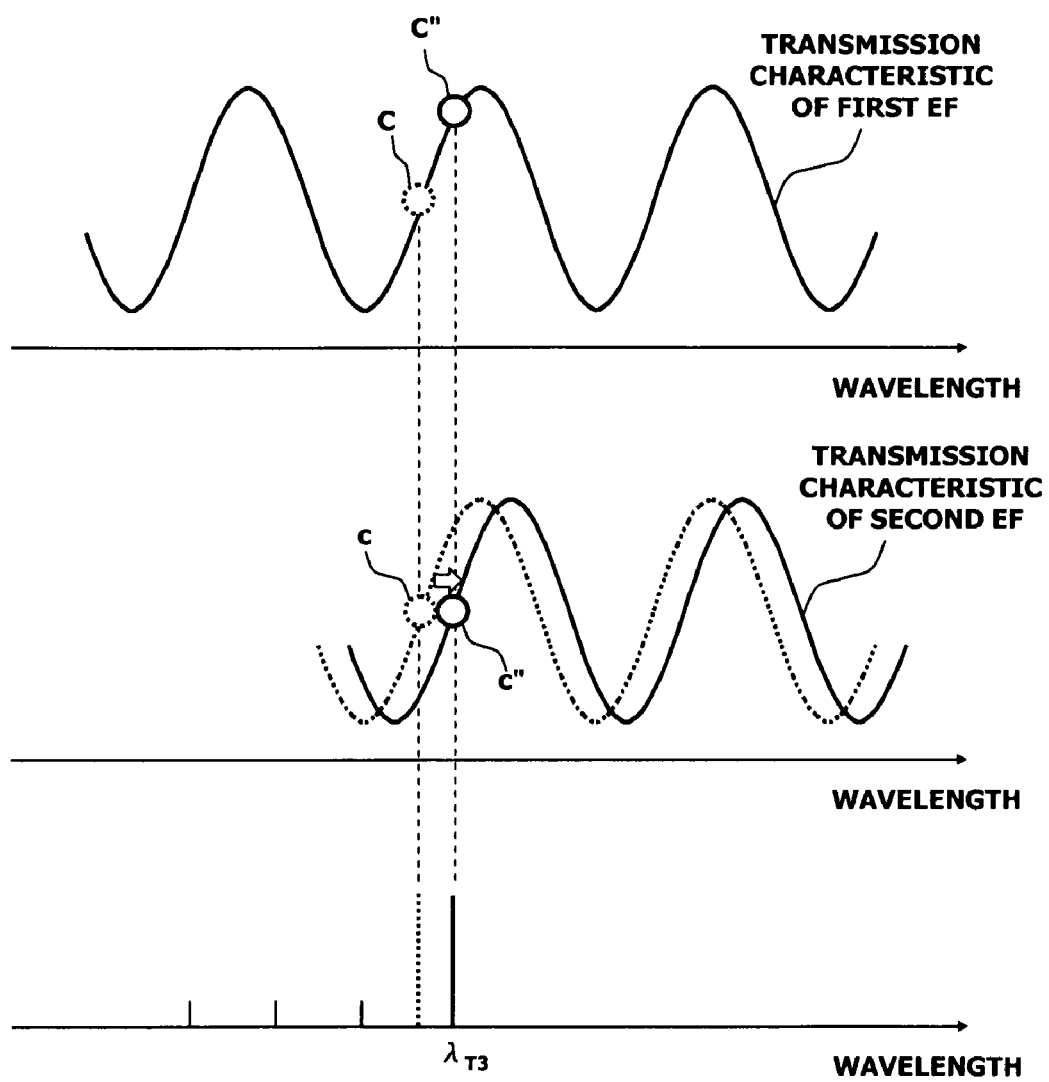
FIG. 20 is a diagram illustrating a control state in a second half in a case where the wavelength is locked at $\lambda_{T3}$ with respect to the wavelength intervals of 37.5 GHz, in the above embodiment.

Furthermore, in a case where the target wavelength is away by 37.5 GHz×3=112.5 GHz to the long wavelength side from the wavelength locking point A of the first etalon filter 411, the wavelength locking point of the first etalon filter 411 that is closest to the target wavelength becomes the point C. Consequently, as with the case illustrated in FIG. 18, after having brought the temperature of the second etalon filter 421 to a temperature $T_c$ with the output wavelength of the light source 11 being $\lambda_C$, a temperature correction amount $\Delta T_c'$ of the second etalon filter 421 corresponding to the target wavelength is calculated, and the temperature of the second etalon filter 421 is corrected to a temperature $T_c+\Delta T_c'$. Thereby, as illustrated with the solid line in the middle row of FIG. 20, the transmission wavelength characteristic of the second etalon filter 421 shifts by 12.5 GHz to the long wavelength side, and the wavelength locking point c before the temperature correction shifts to the wavelength locking point c'' that corresponds to the target wavelength. By performing temperature control of the light source 11 with this wavelength locking point c'' of the second etalon filter 421 serving as a reference, as illustrated in the lower row of FIG. 20, the output wavelength of the light source 11 is locked at the wavelength $\lambda_{T3}$ on the grid of 37.5 GHz intervals.

As has been described, the optical transmission device is capable, with the combination of the first and second etalon filters 411 and 421 designed with 100 GHz FSR, of performing wavelength control capable of handling wavelength intervals of 50 GHz and 37.5 GHz. Moreover, from a point of view similar to that of the above case of wavelength intervals 37.5 GHz, it is possible to handle a variety of wavelength intervals such as 33.3 GHz and 25 GHz. Therefore, as described above, it is possible to easily realize a multigrid capable optical transmission device at low cost.

In the embodiment and specific working example of multigrid handling described above, there has been described the case where the cycles (FSR) of the first and second etalon filters are equal. However, even if the cycles of the first and second etalon filters are different, the wavelength control of the invention can be executed. However, in those cases where the cycle of the second etalon filter is shorter than the cycle of the first etalon filter, a plurality of slope portions of the second etalon filter having the same slope direction are present within the one cycle of the first etalon filter. Therefore, there is a possibility that the phase position of the second etalon filter may be incorrectly identified when adjusting the relative phase relationship in the first and second etalon filters. Moreover, in those cases where the cycle of the second etalon filter is longer than the cycle of the first etalon filter, it is necessary to variably adjust the phase of the second etalon filter for a duration of a plurality of cycles of the first etalon filter. Therefore there is a possibility that an amount of time required for wavelength control may become longer and it may become difficult to perform efficient control. Consequently, in consideration of the above points, it is preferable that the cycles of the first and second etalon filters be made equal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wavelength control method that controls the wavelength of light using a cyclic filter, the transmittance of which changes cyclically with respect to wavelength, the method comprising:
   giving a control target light respectively to a first cyclic filter with a fixed transmission wavelength characteristic, and to a second cyclic filter of a variable transmission wavelength characteristic;
   monitoring each transmittance of the first and second cyclic filters with respect to the control target light;
   changing the transmission wavelength characteristic of the second cyclic filter according to the monitored value of the respective transmittances, to thereby control the relative phase relationship of the transmission wavelength characteristics of the first and second cyclic filters; and
   controlling the wavelength of the control target light according to the monitored value of the transmittance of the second cyclic filter with respect to the control target light.

2. The wavelength control method according to claim 1, comprising:
   determining among a plurality of wavelength locking points that may be set for the first cyclic filter, a reference wavelength locking point with a wavelength closest to a target wavelength;
   giving the control target light to the first cyclic filter, monitoring the transmittance of the first cyclic filter with respect to the control target light, and controlling the wavelength of the control target light so that the monitored value of the transmittance matches with the transmittance corresponding to the reference wavelength locking point;
   giving a control target light, the wavelength of which is controlled with use of the first cyclic filter, to the second cyclic filter, monitoring the transmittance of the second cyclic filter with respect to the control target light, and controlling the transmission wavelength characteristic of the second cyclic filter according to the monitored value of the transmittance, to thereby match the wavelength corresponding to the wavelength locking point of the second cyclic filter with the wavelength corresponding to the reference wavelength locking point of the first cyclic filter;
   controlling the transmission wavelength characteristic of the second cyclic filter according to the difference between the target wavelength and the wavelength corresponding to the reference wavelength locking point of the first cyclic filter, to thereby match the wavelength corresponding to the wavelength locking point of the second cyclic filter with the target wavelength; and controlling the wavelength of the control target light so that the monitored value of the transmittance at the time of giving the control target light to the second cyclic filter matches with the transmittance that corresponds to the wavelength locking point of the second cyclic filter.

3. The wavelength control method according to claim 2, comprising:
when the second cyclic filter has a characteristic in which the transmission wavelength characteristic is variable with control of temperature;
selecting among a plurality of wavelength locking points that may be set for the first cyclic filter, two of the adjacent wavelength locking points to perform a calibration process for the second cyclic filter, and obtaining and storing a relationship of temperature changes of the second cyclic filter with respect to changes in wavelengths from the wavelength corresponding to one wavelength locking point of the two wavelength locking points to the wavelength corresponding to the other wavelength locking point; and
when controlling the transmission wavelength characteristic of the second cyclic filter according to the difference between the target wavelength and the wavelength corresponding to the reference wavelength locking point of the first cyclic filter, calculating a temperature control amount of the second cyclic filter using the relationship which has been obtained and stored in the calibration process.

4. An optical transmission device comprising:
a light source configured to output an optical signal of variable wavelength;
an optical splitter configured to branch part of the optical signal output from the light source as a monitoring light; and
a wavelength controller having a first cyclic filter section and a second cyclic filter section to which the monitoring light branched by the splitter is respectively given, and a wavelength control circuit configured to control the output wavelength of the light source based on output information of the first and second cyclic filter sections, wherein:
the first cyclic filter section has: a first cyclic filter that has a transmission wavelength characteristic in which the transmittance changes cyclically, and to which the monitoring light branched in the splitter is given; a first transmitted light power detector configured to detect the transmitted light power of the first cyclic filter; and a transmission wavelength characteristic fixing section configured to fix the transmission wavelength characteristic of the first cyclic filter;
the second cyclic filter section has: a second cyclic filter that has a transmission wavelength characteristic in which the transmittance changes cyclically, and to which the monitoring light branched in the splitter is given; a second transmitted light power detector configured to detect the transmitted light power of the second cyclic filter; and a transmission wavelength characteristic variable section configured to variably control the transmission wavelength characteristic of the second cyclic filter; and
the wavelength control circuit is configured to monitor the respective transmittances of the first and second cyclic filters with respect to the monitoring light based on the detection results of the first and second transmitted light power detectors, and to use the transmission wavelength characteristic variable section in order to change the transmission wavelength characteristic of the second cyclic filter, according to the monitored value of the respective transmittances, to thereby control the relative phase relationship of the transmission wavelength characteristics of the first and second cyclic filters, and then to control the output wavelength of the light source according to the monitored value of the transmittance based on the detection results of the second transmitted light power detector.

5. The optical transmission device according to claim 4, wherein
the wavelength control circuit is configured: to determine among a plurality of wavelength locking points that may be set for the first cyclic filter, a reference wavelength locking point with a wavelength closest to a target wavelength; to monitor the transmittance of the first cyclic filter with respect to the monitoring light, based on the detection results of the first transmitted light power detector; to control the output wavelength of the light source so that the monitored value of the transmittance matches with the transmittance that corresponds to the reference wavelength locking point, and then to monitor the transmittance of the second cyclic filter with respect to the monitoring light, based on the detection results of the second transmitted light power detector; and to use the transmission wavelength characteristic variable section in order to control the transmission wavelength characteristic of the second cyclic filter, according to the monitored value of the transmittance, to thereby match the wavelength corresponding to the wavelength locking point of the second cyclic filter with the wavelength corresponding to the reference wavelength locking point of the first cyclic filter, and then to use the transmission wavelength characteristic variable section in order to control the transmission wavelength characteristic of the second cyclic filter, according to the difference between the target wavelength and the wavelength corresponding to the reference wavelength locking point of the first cyclic filter, to thereby match the wavelength corresponding to the wavelength locking point of the second cyclic filter with the target wavelength, and then to control the output wavelength of the light source, so that the monitored value of the transmittance based on the detection results of the second transmitted light power detector matches with the transmittance corresponding to the wavelength locking point of the second cyclic filter.

6. The optical transmission device according to claim 5, wherein:
the second cyclic filter has a characteristic in which the transmission wavelength characteristic is variable with control of temperature, and
the wavelength control circuit is configured to select two adjacent wavelength locking points among a plurality of wavelength locking points that may be set for the first cyclic filter and to perform a calibration process of the second cyclic filter, to thereby obtain and store in a built-in memory a relationship of temperature changes of the second cyclic filter with respect to changes in wavelengths from the wavelength corresponding to one of the two wavelength locking points to the wavelength corresponding to the other wavelength locking point, and then to calculate a temperature correction amount for the second cyclic filter, using the relationship stored in the built-in memory when controlling the transmission wavelength characteristic of the second cyclic filter according to the difference between the target wavelength and the wavelength corresponding to the reference wavelength locking point of the first cyclic filter.

7. The optical transmission device according to claim 5, wherein
the respective wavelength locking points of the first and second cyclic filters are set on slope portions which are intermediately positioned between a peak portion and a valley portion of a cyclic transmission wavelength characteristic.

8. The optical transmission device according to claim 4, wherein
there is provided an optical power controller configured to control a power of optical signals output from the light source at a constant level.

9. The optical transmission device according to claim 4, wherein
the first and second cyclic filters are such that cycles of their transmission wavelength characteristics are equal.

10. The optical transmission device according to claim 4, wherein
the wavelength control circuit is capable of controlling the output wavelength of the light source at arbitrary wavelengths of different wavelength intervals on a plurality of grids.

11. The optical transmission device according to claim 4, wherein
the first and second cyclic filters are etalon filters.

12. The optical transmission device according to claim 11, wherein
the transmission wavelength characteristic fixing section is configured to control the temperature of the etalon filter at a constant temperature.

* * * * *